US005233232A

United States Patent [19]
Steubing et al.

[11] Patent Number: 5,233,232
[45] Date of Patent: Aug. 3, 1993

[54] GLITCH TRIGGER CIRCUIT

[75] Inventors: Carlton Steubing, Tigard; Jeffrey O. Bradford, Portland, both of Oreg.

[73] Assignee: Tektronix, Inc., Wilsonville, Oreg.

[21] Appl. No.: 848,773

[22] Filed: Mar. 10, 1992

Related U.S. Application Data

[62] Division of Ser. No. 678,385, Apr. 1, 1991, Pat. No. 5,124,597.

[51] Int. Cl.$^5$ .............................................. H03K 5/22
[52] U.S. Cl. ..................................... 307/234; 307/265; 307/518; 328/111; 328/120
[58] Field of Search ............... 307/234, 265, 268, 520, 307/518; 328/111, 120

[56] References Cited

U.S. PATENT DOCUMENTS

| | | | |
|---|---|---|---|
| 3,634,869 | 1/1972 | Hsueh | 328/111 |
| 4,775,840 | 10/1988 | Ohmori et al. | 307/234 |
| 4,786,823 | 11/1988 | Abe et al. | 307/234 |
| 4,847,577 | 7/1989 | Gerhart et al. | 307/234 |
| 4,857,760 | 8/1989 | Stuebing | 307/234 |

Primary Examiner—Timothy P. Callahan
Attorney, Agent, or Firm—Boulden G. Griffith

[57] ABSTRACT

A timer circuit provides a wide range of precise and substantially accurate time intervals. The timer circuit includes a ramp generator circuit having a first input for receiving an input signal to start a ramp signal, a second input for receiving a ramp timing control signal, and an output for providing a ramp signal. A comparator has a first input coupled to the output of the ramp generator, a second input coupled to a reference voltage source, and an output for providing an end ramp signal. A counter circuit has a first input for receiving the end ramp signal to begin counting, a second input for receiving a counter timing control signal, and an output for providing a terminal count signal. The end ramp signal and the terminal count signal are combined in an AND gate to provide a signal that is delayed by a predetermined amount from the input signal.

19 Claims, 16 Drawing Sheets

DeMORGAN GATE

BIAS CELL

GLITCH TRIGGER CIRCUIT

This is a division of application Ser. No. 07/678,385 filed Apr. 1, 1991 now U.S. Pat. No. 5,124,597.

BACKGROUND OF THE INVENTION

This invention relates to timer circuits for providing a selectable time interval, and more particularly to a low cost method and apparatus for improving the resolution of the selected time interval.

One type of timer circuit includes a ramp generator for providing the selected time interval. Ramp generator circuits are typically precision analog circuits that provide an analog ramp signal having known linear characteristics in response to an input signal. The slope of the ramp is controlled by a ramp timing control input, typically a digitally-controlled precision current source. A comparator receives the ramp signal and a reference voltage and generates an output signal when the magnitude of the ramp increases beyond the reference voltage. An example of a prior art ramp generator and a prior art comparator is taught in U.S. Pat. No. 4,843,255 ('255) to Stuebing. The ramp generator and comparator taught in the '255 patent are designed with bipolar transistors to achieve high operating speed, a wide range of ramp slopes and corresponding time intervals, and temperature stability. Since the ramp generator, including the comparator, is designed with bipolar transistors, the output of the comparator has emitter-coupled logic ("ECL") voltage levels. ECL logic levels are typically 3.5 volts for a logic low and 4.1 volts for a logic high.

Another type of timer circuit includes a counter-timer for providing the time interval. Counter-timer circuits are typically digital circuits that initiate a count of a user-selectable number of clock cycles in response to an input signal. The number of clock cycles desired is loaded into the counter via a digital bus. After the selected number of clock cycles is reached by the counter, a terminal count output signal is generated. Thus, the terminal count signal occurs after a preselected time interval equal to the number of counted clock cycles. Counter-timer circuits are manufactured by Motorola (MC74AC161), National Semiconductor (74AC161), Texas Instruments (SN74HC160), and Signetics (74HC161), among others. The counter-timer circuits listed above are designed with complementary metal-oxide-silicon ("CMOS") transistors to provide a wide range of time intervals with low power consumption, but only at lower operating speeds (time intervals not less than ten nanoseconds). The output of the counter-timer has CMOS voltage levels, typically zero volts for a logic low and five volts for a logic high.

A ramp generator circuit is capable of finely resolving a time interval. However, the accuracy of the time interval of a ramp generator circuit is a function of how accurately the slope of the ramp can be generated. The slope of the ramp can usually be maintained within a certain percentage of a nominal slope. For example, short term jitter of such an analog ramp can be on the order of ±1%, while DC drift over temperature can be on the order of ±5%. Thus, if a 1 μs time interval is required, short term jitter is ±10 ns, and the time interval is accurate over temperature within ±50 ns. Correspondingly, if a 100 ns time interval is required, short term jitter is ±1 ns, and the time interval is accurate over temperature within ±5 ns. Therefore, at shorter time intervals, although the percentage of accuracy is not changed, the absolute accuracy is improved. As absolute accuracy of a timing interval improves for a faster ramp, absolute resolution or precision of the timing interval may also improve.

A counter-timer circuit can resolve a time interval within plus or minus one half of a clock cycle. The accuracy of the time interval of a simple low-cost CMOS counter-timer circuit is a function of jitter on the terminal count output signal, also plus or minus one half clock cycle. Jitter exists because the system clock coupled to the counter-timer is asynchronous with the input signal. Thus, if a 1 μs time required, the time interval is accurate within plus or minus one half clock cycle, ±10 ns or ±1%, assuming a 50 MHz clock signal. Correspondingly, if a 10 μs time interval is required, the time interval is still accurate within plus or minus one half clock cycle, ±10 ns, but this represents a relative accuracy of ±0.1%. Therefore, at longer time intervals, although the absolute accuracy has not changed, the percentage of accuracy is improved. One important limitation of conventional counter circuits, however, is reset time, because the counter circuit is not operational and cannot be restarted during this time. Typical counter circuits require as much as four clock cycles or 80 ns to properly reset.

Improved accuracy, resolution, and reset time can be obtained with more elaborate and expensive counter-timer circuits. For example, one type of counter-timer circuit includes an oscillator to generate an internal clock signal. The internal clock is triggered by the input signal, and therefore the input signal is synchronous with the clock signal. The resultant terminal count output signal does not exhibit jitter. However, the internal clock requires additional circuitry such as a precision high speed startable oscillator, thus greatly adding to the complexity and cost of the circuit. In addition, for time intervals not an integral number of clock cycles, resolution and accuracy are still determined by the period of the clock signal.

Another type of counter-timer circuit that improves both accuracy and resolution is an ECL counter-timer circuit. An ECL counter-timer circuit operates with clock signals approaching one gigahertz (1000 MHz). Such an extremely fast clock signal virtually eliminates jitter at most operating frequencies and greatly improves accuracy. An ECL counter-timer operating with a fast clock signal also has a shorter reset time than its CMOS counterpart. However, the enhanced performance is at the price of greatly increased circuit cost and high power consumption.

What would be desirable is a timer circuit that combines the resolution of a ramp generator and low cost of a CMOS counter-timer to provide a wide range of finely resolved and substantially accurate time intervals.

SUMMARY OF THE INVENTION

It is therefore an object of the present invention to provide a relatively low cost timer circuit.

It is another object of the present invention to provide a timer circuit having a wide range of finely resolved and substantially accurate time intervals.

It is another object of the present invention to combine a ramp generator having an ECL level output with a counter-timer circuit having a CMOS level output.

It is a further object of the present invention to provide a timer circuit that can be quickly reset.

It is still a further object of the present invention to provide precision circuit blocks including a comparator, a voltage to current converter, and other such circuits to improve the resolution and accuracy of the timer circuit.

It is still a further object of the present invention to provide pulse discriminating trigger circuits employing the timer circuit of the present invention.

These and other objects, features, and advantages of the present invention are apparent to those having ordinary skill in the art from a review of the drawing figures and the following detailed description.

According to the present invention a timer circuit includes a ramp generator circuit having a first input for receiving an input signal to start a ramp signal, a second input for receiving a ramp timing control signal, and an output for providing a ramp signal. A comparator has a first input coupled to the output of the ramp generator, a second input coupled to a reference voltage source, and an output for providing an end ramp signal. A counter circuit has a first input for receiving the end ramp signal to begin counting, a second input for receiving a counter timing control signal, and an output for providing a terminal count signal. The end ramp signal and the terminal count signal are combined in an AND gate to provide an output signal that is delayed by a predetermined time interval from the input signal.

In operation, the counter is disabled and the total time interval is provided only by the ramp generator for time intervals less than 1 μs. The total time interval is equal to the ramp time interval plus the counter time interval for time intervals above 1 μs. This enables the total time interval to be finely resolved (due to the ramp generator) and substantially accurate (due to the counter-timer), even after extremely long time intervals. In addition, a minimum, fixed ramp time interval of at least four clock cycles allows the counter output enough time to properly settle. Therefore, the timer circuit can be immediately reused or reset. The minimum, fixed ramp time interval can also be increased to improve monotonicity between timing ranges provided by the ramp generator and timing ranges provided by both the ramp generator and the CMOS counter.

DETAILED DESCRIPTION OF THE INVENTION

Figure 1:
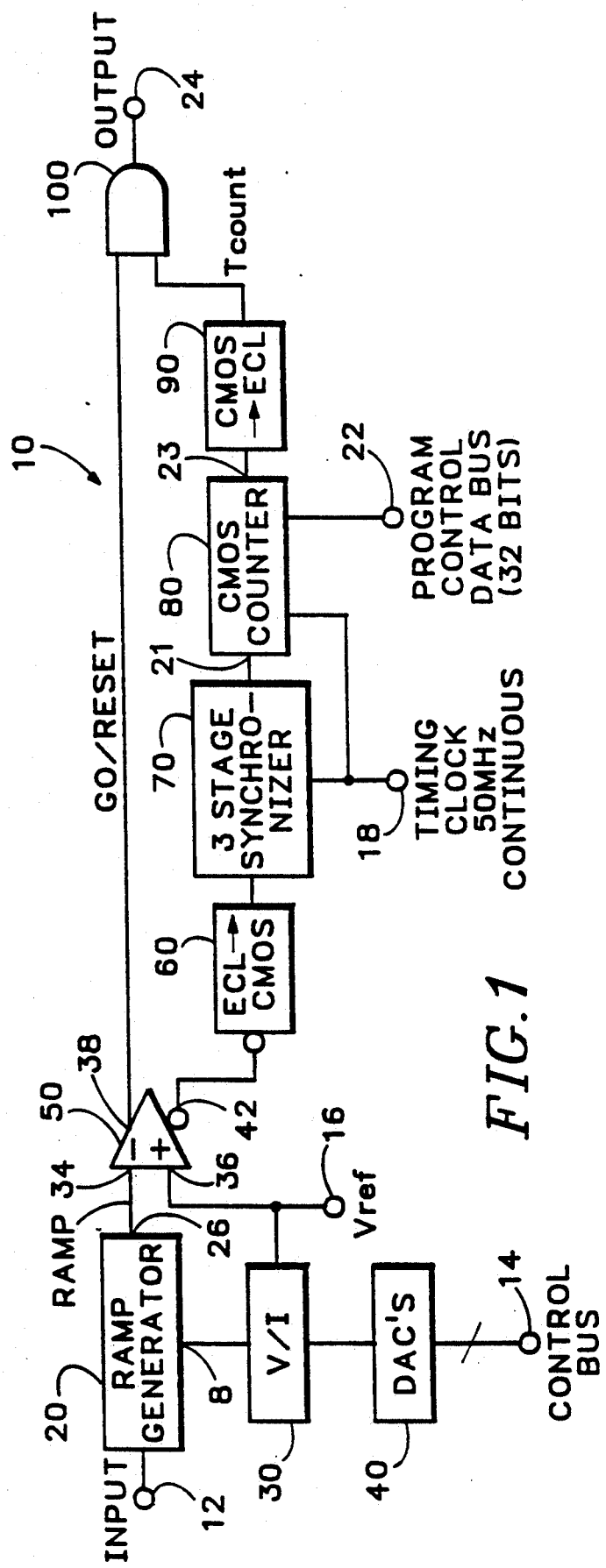
FIG. 1 is a block/schematic diagram of a timer circuit according to the present invention.

Referring to the combined block and schematic diagram of FIG. 1, a timer circuit 10 includes a ramp generator circuit 20 having a first input 12 for receiving an input or ramp start signal, a second input 8 for receiving a ramp timing control signal, and an output 26 for providing a ramp signal. A control bus 14 provides a digital code representing the desired ramp slope to digital-to-analog converter ("DAC") 40. The output voltage of DAC 40 is converted into a ramp timing control current by a voltage-to-current converter circuit 30. The ramp timing control current is compatible with second input 8 of ramp generator 20 as is described in greater detail below. A positive-going step signal received at input 12 initiates a negative-going ramp signal at the output 26. A negative-going step signal received at input 12 resets the ramp signal at the output 26. The ramp signal has an initial voltage of about 4.1 volts and linearly ramps down to a final minimum voltage of about 3.3 volts. Once the ramp signal has reached this predetermined minimum voltage, the ramp signal remains at 3.3 volts as long as the input signal remains high. The operation of the ramp generator circuit 20 is best viewed in the first two timing waveforms of FIGS. 13-14. The input signal that initiates the ramp is designated "Input" and the ramp signal output is designated "Ramp". Note that the ramp signal is shown as positive-going in FIGS. 13 and 14.

The timer circuit 10 of FIG. 1 further includes an ECL level comparator 50 having a negative input 34 coupled to the output 26 of the ramp generator 20, a positive input 36 coupled to a reference voltage source 16 designated "VREF", and noninverting and inverting outputs 38 and 42 for providing end ramp and inverted end ramp signals. The reference voltage is set to about 3.5 volts to change the state of outputs 38 and 42 when the ramp signal is near the final minimum voltage. Thus, the end ramp signal at output 38 is an ECL level logic low voltage when the ramp is initiated and becomes an ECL level logic high voltage after the ramp signal becomes more negative that the reference voltage source 16. The reference voltage VREF is set slightly higher than the final minimum voltage of the ramp signal. A precision temperature compensated reference voltage source 16 is desirable for converting the slope of the ramp signal into a time interval that is substantially invariant with temperature or semiconductor process variations. The operation of the ramp generator 20 and compensated reference voltage 16 is explained in greater detail below.

A CMOS counter circuit 80 has a first input 21 coupled through an inverting ECL-to-CMOS converter 60 to the inverting output 42 of the comparator 50. The first input 21 receives the end ramp signal that initiates a count of a number of clock cycles indirectly specified by the user. A second input 22 receives a counter timing control signal, which is a digital bus specifying the number of clock cycles, and thus the time interval, to be counted. A third input to the counter 80 is the timing clock 18. The output 23 of the counter 80 is coupled through a CMOS-to-ECL converter 90 to one input of an AND gate 100. The output provides a terminal count signal ("Tcount") once the specified number of clock cycles has been counted. The counter 80 can be reset at any time before the terminal count is reached. If counter 80 is reset, the output remains low and the counter 80 becomes ready for a new count after about 80 ns or 4 20 ns clock cycles. In the present invention, the reset time provided by the minimum, fixed ramp is set to 900 ns or 45 20 ns clock cycles, as is explained in greater detail below.

The AND gate 100 has two inputs that are coupled to the output 38 of the comparator 50 and the output 23 of the counter 80 (through CMOS-to-ECL converter 90). The end of ramp signal ("Go/Reset") and the terminal count signal, Tcount, are thus combined to provide a signal that is delayed by a predetermined time interval from the input signal. The operation of the timer circuit 10 is explained in greater detail below.

ECL-to-CMOS converter 60 is used to convert the ECL level output of comparator 50 into a CMOS level input to CMOS counter 80. CMOS-to-ECL converter 90 is used to convert the CMOS level output of CMOS counter 80 to an ECL level input to AND gate 100. A three stage synchronizer flip-flop circuit 70 is placed in the input of CMOS counter 80 to minimize the occurrence of metastable (invalid) logic states.

Figure 13:
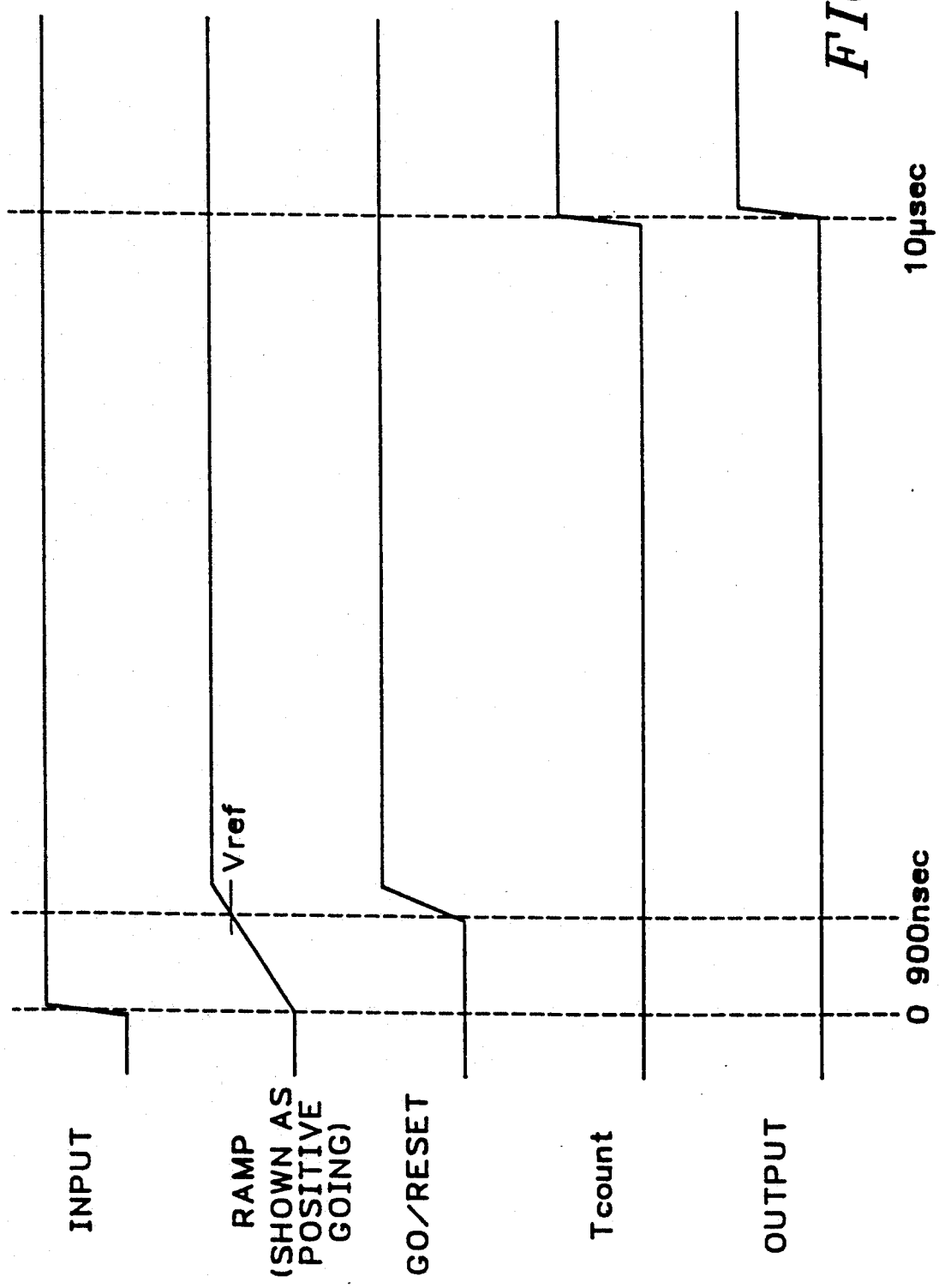
FIGS. 13-14 are timing diagrams for illustrating the operation of the timer circuit of the present invention.
Figure 14:
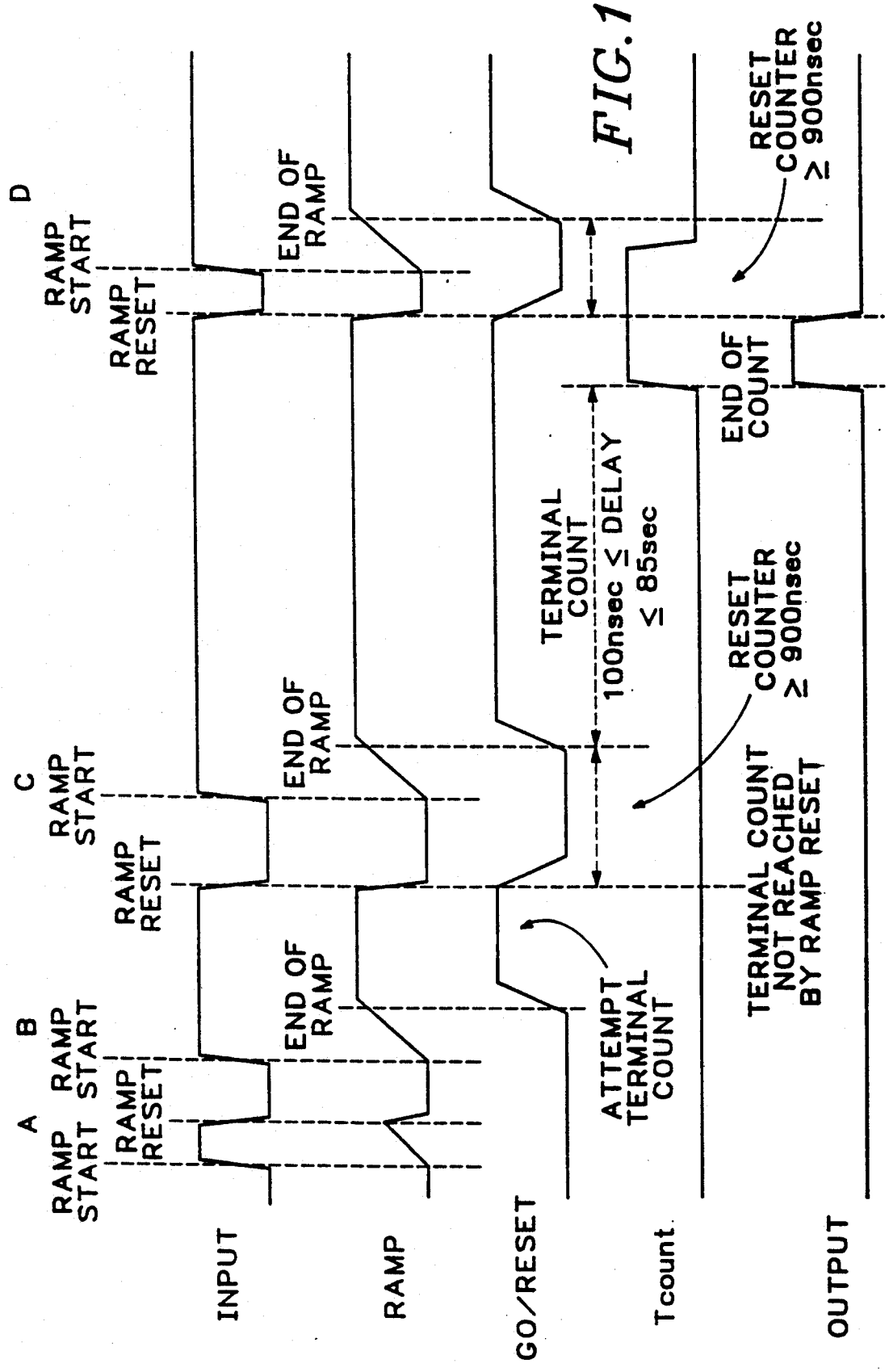

The operation of the timer circuit 10 can be best understood with reference to the timing diagrams of FIGS. 13 and 14, in conjunction with the block/schematic diagram of FIG. 1. With reference to the timing diagram of FIG. 13, voltage waveform Input represents the voltage at input terminal 12, which is the input or ramp start signal. The Input waveform is a step function that initiates the ramp signal. The Ramp waveform represents the voltage at the output 26 of the ramp generator 20. Note that Ramp is shown as a positive going ramp waveform, although the actual ramp is negative going. An end of ramp Go/Reset signal represents the voltage at the noninverting output 38 of the comparator 50. (The inverting output 42 coupled to the ECL-to-CMOS converter 60 is not shown as one of the signals in FIG. 13.) After the Ramp signal reaches the reference voltage VREF, the end of ramp Go/Reset signal changes state from an ECL level logic low to an ECL level logic high. The difference in time between the change in state of the end of ramp signal and the change in state of the input signal defines a first time interval, shown in FIG. 13 to be 900 ns. This first time interval is also referred to in the specification as the minimum, fixed ramp time interval.

The end of ramp Go/Reset signal not only defines the first time interval, but initiates the CMOS counter 80 to count for a predetermined number of clock cycles. The number of cycles is set by the counter timing control at terminal 22. The nature of the timing control varies for different counters, but in general a digitally coded word delivered via a digital bus represents the desired number of clock cycles. After the clock cycles are counted by counter 80, the terminal count signal, Tcount, goes high. The difference in time between the change in state of the end of ramp Go/Reset signal and the change in state of the terminal count Tcount signal defines a second time interval, shown in FIG. 13 to be 9100 ns.

Thus, the total time interval of timer circuit 10 measured from the input 12 to the output 24 is substantially equal to the sum of the first and second time intervals, or about 10 $\mu s$ as shown in FIG. 13. The output voltage waveform, "Output" changes logic states once the total time interval has elapsed. In this situation, the Output voltage waveform is substantially equal to the Tcount waveform. Output only changes logic states when Tcount changes logic states since the noninverting output 38 of the comparator 50, Go/Reset, remains a logic high after Ramp reaches the final value.

If the total time interval required is less than 1 $\mu s$, the total time interval is provided by ramp generator 20. Thus, the total time interval less than 1 $\mu s$ is adjusted by adjusting only the first time interval. To generate time intervals of less than 1 $\mu s$, the ramp timing control 14 is set to provide the appropriate time interval. The counter timing control 22 is set to provide the CMOS counter 80 with a terminal count of zero clock cycles. Such a command forces the output of counter 80 high, forcing Tcount at the input of AND gate 100 high. The output 24 thus is a function solely of the end of ramp signal provided at the output 38 of comparator 50.

If time intervals greater than 1 $\mu s$ are required, the total time interval is a first time interval (also designated fixed ramp time interval) provided by the ramp generator 20 and the remainder is provided by counts of the CMOS counter 80. The break-over point, 1 $\mu s$, is known as the maximum ramp time interval. In the preferred embodiment, the maximum ramp time interval is desirably not equal to the minimum or fixed ramp time interval. A thorough discussion of the selection of the maximum ramp time interval is provided below in the subsection entitled "Choosing the Maximum Ramp Time Interval."

The total time interval more than 1 $\mu s$ is adjusted by adjusting the second time interval of the counter 80. The first time or fixed ramp interval provided by the ramp generator 20 is set to more than 80 ns to allow for the settling time of counter 80 if a reset is requested before the terminal count is reached. A thorough discussion of the selection of the fixed ramp time interval is provided below in the subsection entitled "Monotonicity and Choosing a Fixed Ramp Time Interval." While the first time interval of the ramp generator can be adjusted for combined ramp and counter time intervals above 1 $\mu s$, it is not recommended. The resolution for long time intervals is determined by the clock period of the CMOS counter 80. However, extremely fine resolution is rarely required or even desirable when a long time interval is selected.

The timing diagram of FIG. 14 illustrates an example of four possible operating conditions of the timer circuit 10 wherein the total time interval required is greater than 1 $\mu s$. In this example, the four operating conditions occur sequentially in response to the positive going edges of the Input signal, and are designated generally at times A, B, C, and D.

For the first operating condition, the timer circuit 10 is reset before 900 ns has elapsed. Thus, Input is a pulse less than 900 ns, and a Ramp signal of less than 900 ns is generated, which is quickly reset at the negative going edge of the input signal. In this operating condition, the Input is reset before an end of ramp Go/Reset signal is generated and therefore the output of the counter, Tcount, and the output of the timer circuit, Output, both remain low.

In the second operating mode, the reset does not occur until a time greater than 900 ns. Thus, the ramp signal reaches a final value, and an end of ramp Go/Reset signal is generated. However, the terminal count of the counter 80 is not reached, and thus Tcount and Output both remain low.

In the third operating condition, the terminal count of the counter 80 is reached, and thus Tcount and Output both change to a logic high. The timer circuit 10 is subsequently reset at time D, and therefore Input, Ramp, Go/Reset, and Output all return to a logic low. Note, however, that the counter 80 output, Tcount, cannot return low until another 60 to 80 ns have elapsed. Consequently, when a new command is received in the fourth operating condition at the input 12, counter 80 settles while the new ramp signal ramps towards the final value. When the end of ramp signal Go/Reset is generated, counter 80 has settled and is ready to start a new count cycle.

Operational Integrated Circuit Example

A circuit implementation of the timer circuit 10 has been simulated and (except for the DAC 40 and the CMOS counter 80) been fabricated on an integrated circuit using bipolar transistors. The transistor level configuration and performance of this circuit implementation is described below in greater detail. It is appreciated by those skilled in the art that other circuit implementations for the ramp generator 20, voltage to current generator 30, comparator 50, synchronizer 70, converters 60 and 80, and AND gate 100 are possible. Thus, the following circuit example is not in any way intended to limit the basic configuration or operation of the timer circuit 10 shown in FIG. 1 and described above.

Figure 2:
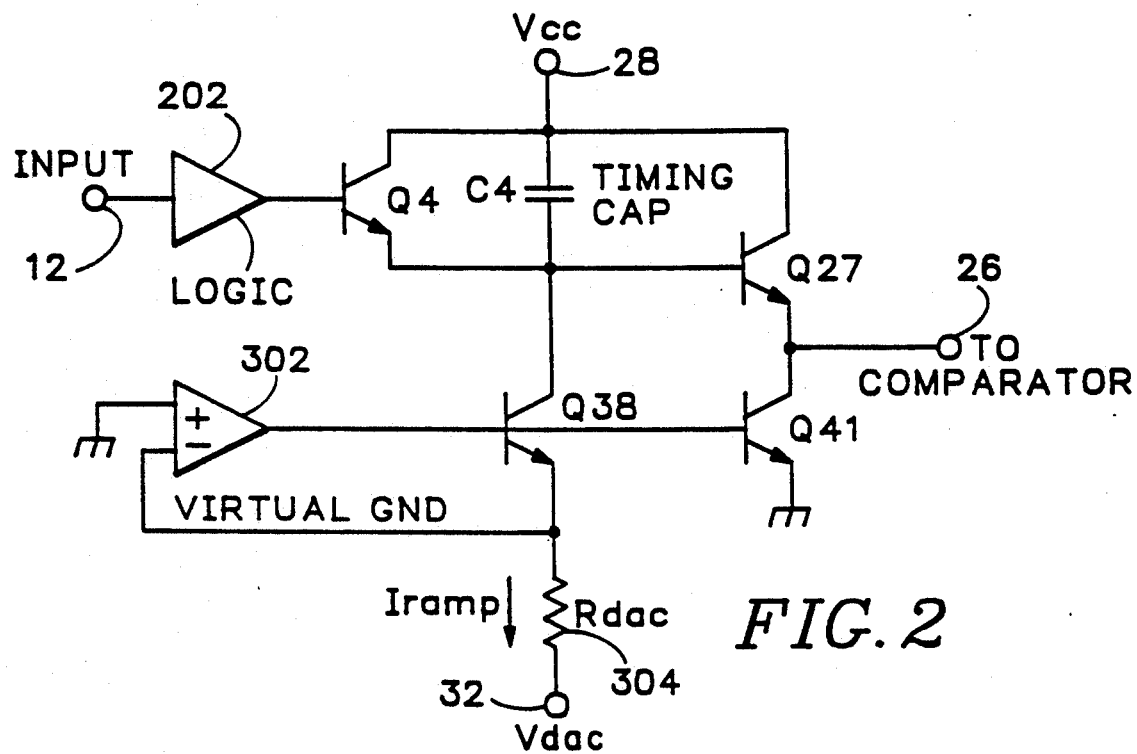
FIGS. 2-4 are block/schematic diagrams of the ramp generator and the voltage-to-current converter circuit shown in FIG. 1.

The ramp generator 20 and voltage-to-current converter 30 are shown in more detail in FIG. 2. The basic ramp is formed by discharging capacitor C4 with a selectable current, Iramp. The current Iramp is set by a voltage Vdac at terminal 32, supplied by a DAC (not shown in FIG. 2), which is applied across a current setting resistor 304 having a value of Rdac. The value of Iramp is substantially equal to Vdac divided by Rdac, since resistor 304 is coupled between Vdac and virtual ground. The virtual ground voltage is supplied by operational amplifier 302 in conjunction with transistor Q38. The feedback of operational amplifier 302 forces the voltage on the positive input, which is at ground, to equal the voltage on the negative input.

The current supplied by transistor Q38 is ideally compensated for loss of current due to transistor alpha, in order that the current flowing through capacitor C4 is substantially equal to Iramp. Transistor Q41 has a base coupled to the base of transistor Q38 and an emitter coupled to ground. Therefore, the current flowing in the collector of transistor Q41 is substantially equal to the current flowing in the collector of transistor Q38. Transistor Q27 receives the collector current of transistor Q41. The base current of transistor Q27 is added to the collector current of transistor Q38 to substantially correct for transistor Q38 alpha current loss. Transistor Q27 also acts as an emitter follower buffer stage, wherein the emitter forms the output 26 of the ramp generator that is coupled to the negative input 34 of comparator 50.

The ramp signal is gated on and off by transistor Q4. In an initial steady state, logic block 202 couples the base of transistor Q4 to a voltage approximately equal to Vcc. The voltage on the capacitor C4 is thus clamped to approximately a base-to-emitter voltage of transistor Q4 below Vcc. To gate on (initiate) the ramp signal, logic block 202 couples the base of transistor Q4 to a voltage about 870 millivolts below the prior base voltage. Since the emitter is clamped by the voltage on capacitor C4, transistor Q4 turns off, and the voltage of capacitor C4 linearly discharges. The rate of discharge is determined by the value of C4 and the discharge current, Iramp. Once the voltage on capacitor C4 reaches a sufficiently negative value, transistor Q4 turns on and clamps the capacitor voltage to a minimum final voltage. The voltage on capacitor C4 remains at the final value as long as the logic block 202 holds the base of transistor Q4 low. The ramp is quickly reset by taking the base of transistor Q4 high and discharging the capacitor Q4. When the base of transistor Q4 is returned to a voltage near Vcc, the emitter remains clamped low by the voltage on capacitor Q4. Therefore, transistor Q4 is turned on harder by an additional 870 millivolts of base-to-emitter voltage. An instantaneous discharge path is created from the emitter to the collector of Q4. The charge on capacitor Q4 is quickly discharged and therefore the ramp signal is quickly reset.

Figure 3A:
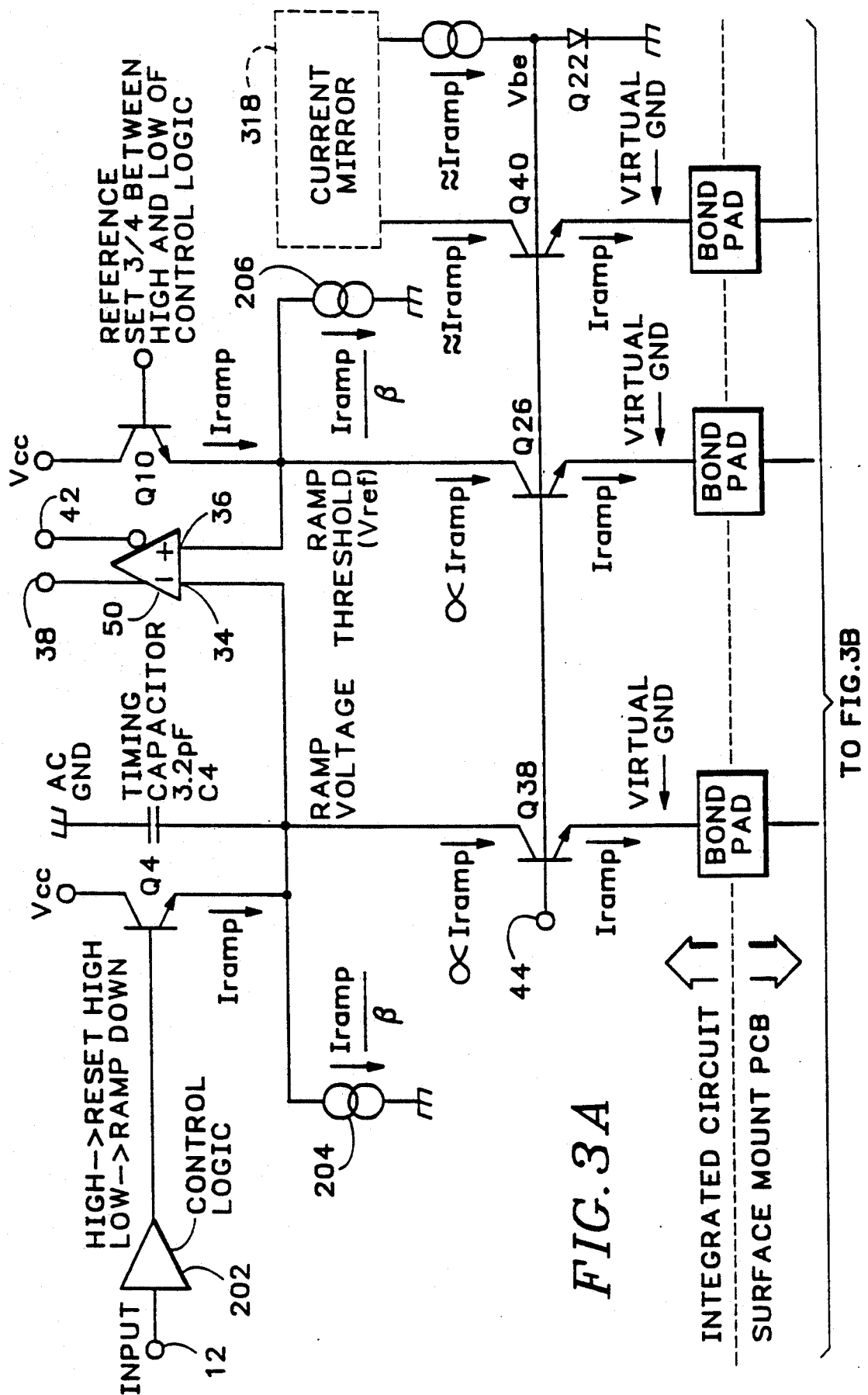
Figure 3B:
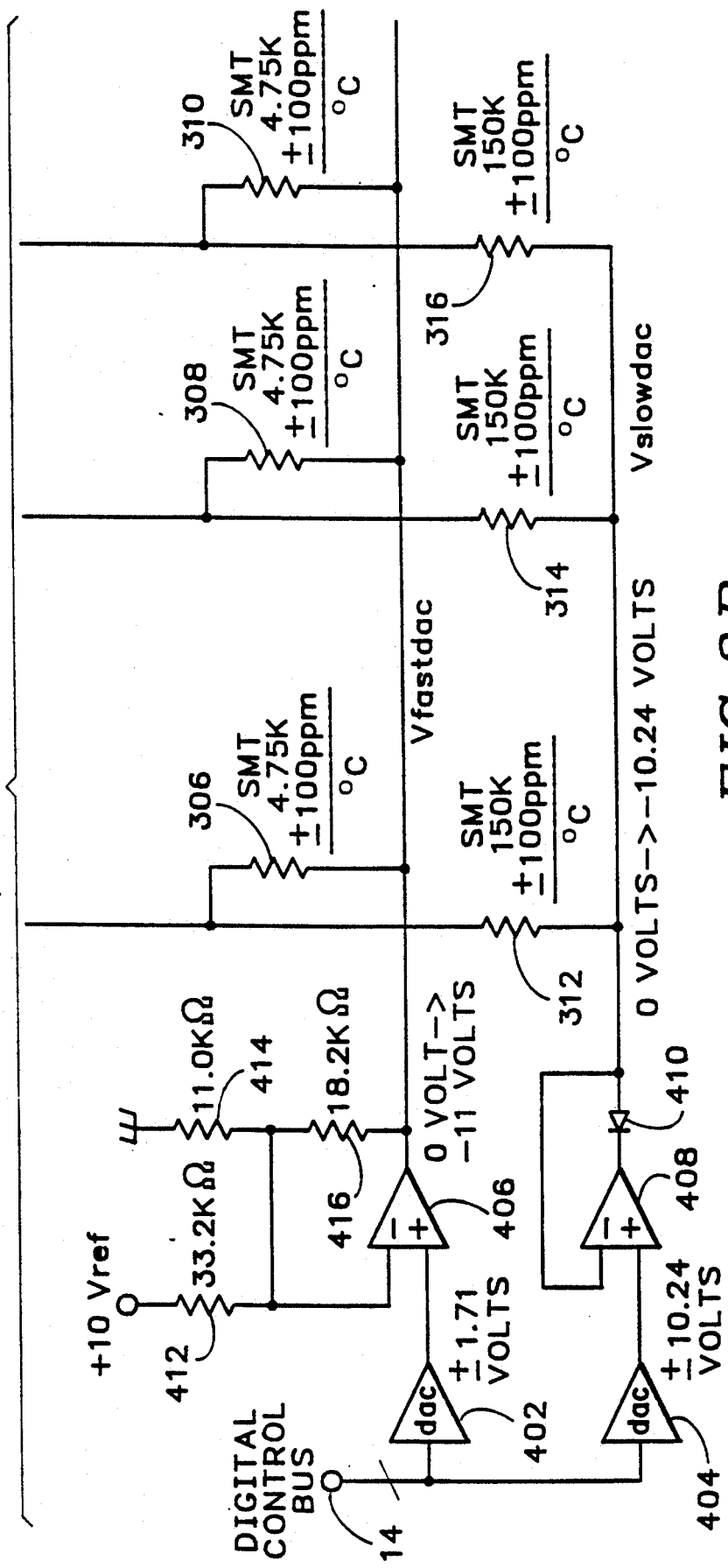

The ramp generator 20, voltage-to-current converter 30, and DAC 40 are shown in greater detail in FIG. 3. In FIG. 3, the ramp reference voltage VREF at the positive input 36 of comparator is shown to be supplied by the emitter of transistor Q10. Transistors Q10 and Q4 are matched and receive identical reference currents through the collectors of transistors Q26 and Q38 and through alpha current compensation current sources 206 and 204. Compensation current source 204 corresponds to the base of transistor Q27 as discussed above and shown in FIG. 2. The base of transistor Q10 is set to a value approximately three-quarters of the difference between the two voltage levels received at the base of transistor Q4. Therefore, if the base of transistor Q4 is switched between Vcc and Vcc minus 870 millivolts, the base of transistor Q10 is set to a voltage equal to Vcc minus about 650 millivolts.

In FIG. 3, the operational amplifier 302 for generating the virtual ground voltage is replaced by current mirror 318, transistor Q40 and diode Q22. This circuit, in conjunction with transistors Q38 and Q26, and resistors 306–316 is a voltage-to-current converter that converts analog voltages from DACs 402 and 404 into reference currents for the ramp generator transistor Q4 and the reference transistor Q10. The cathode of diode Q22 in FIG. 3 is analogous to the positive input of operational amplifier 302 of FIG. 2. The cathode of diode Q22 is coupled to ground or an appropriate constant voltage (AC ground) to establish the virtual ground voltage. The anode of diode Q22 forms a bias line 44 designated "Vbe" for biasing the bases of additional transistors. The reference current, Iramp, is replicated in the emitter current of each additional transistor coupled to the bias line. Therefore, the anode of diode Q22 is analogous to the output of operational amplifier 302 in FIG. 2. The feedback necessary to maintain the voltage of the emitters of transistors Q40, Q26, and Q38 at virtual ground is provided by current mirror 318.

In the current to voltage converter shown in FIG. 3, only one resistor (310/316) is necessary to roughly set the reference current Iramp. (In the preferred embodiment, resistor 310/316 is a parallel combination of two resistors to extend the operational range of the ramp time interval.) However, additional resistors (306/312, 308/314) provide degeneration for increasing the output impedance of transistors Q38 and Q26, and extend the operating range of ramp generator 20.

Therefore, parallel resistors 306/312 and 308/314 are respectively coupled to the emitters of transistors Q38 and Q26. As ca be demonstrated by those skilled in the art, the addition of a resistance in the emitter of a transistor greatly increases the output impedance at the collector. Resistors 306/312 and 308/314 also help to minimize current errors due to mismatches in the base-to-emitter voltages of transistors Q38 and Q26, as well as transistor Q40. While the emitters of transistors Q38 and Q26 can be directly grounded or coupled to a source of constant voltage, it is desirable that emitter resistors be used as shown in FIG. 3 to increase accuracy.

The parallel combination of emitter resistors also increases the dynamic range of the reference current Iramp and thus extends the operating range of ramp generator 20. The single analog voltage Vdac of FIG. 2 is shown to have two components, Vfastdac and Vslowdac, in FIG. 3. Vfastdac generates a ramp signal having a time interval of between 2 ns and 35 ns. DAC 402 converts a portion of a digital word delivered on control bus 14 to an analog voltage. This analog voltage is amplified and buffered by operational amplifier 406 and resistors 412, 414, and 416. The voltage at the output of operational amplifier 406 provides a voltage that varies between zero and −11 volts that is applied to one end of resistors 306-310. Recalling that the other end of resistors 306-310 are coupled to virtual ground, the reference current flowing through resistors 306-310 varies between zero and about 2.3 milliamps. Vslowdac generates a ramp signal having a time interval between 36 ns and 1 μs. DAC 404 converts the remaining portion of the digital word delivered on control bus 14 to an analog voltage. This analog voltage is buffered by operational amplifier 408. Diode 410 in the output of operational amplifier 408 provides a tristate output when DAC 404 generates a positive voltage. The voltage at the output of operational amplifier 408 provides a voltage that varies between zero and −10.24 volts that is applied to one end of resistors 312, 314, and 316. The reference current flowing through resistors 312-316 varies between Zero and about 70 μa. It is desirable that emitter resistors 306-316 be of a type having a low temperature coefficient and an accurate absolute value such as a laser trimmed thin film or thick film resistor. Emitter resistors 306-316 can be integrated onto the same substrate as the ramp generator 20, or can be fabricated as surface mounted components as shown in FIG. 3. Proper selection of the resistor material and careful matching of resistors 306-316 is important to increase accuracy and minimize temperature errors in the ramp signal.

Figure 4A:
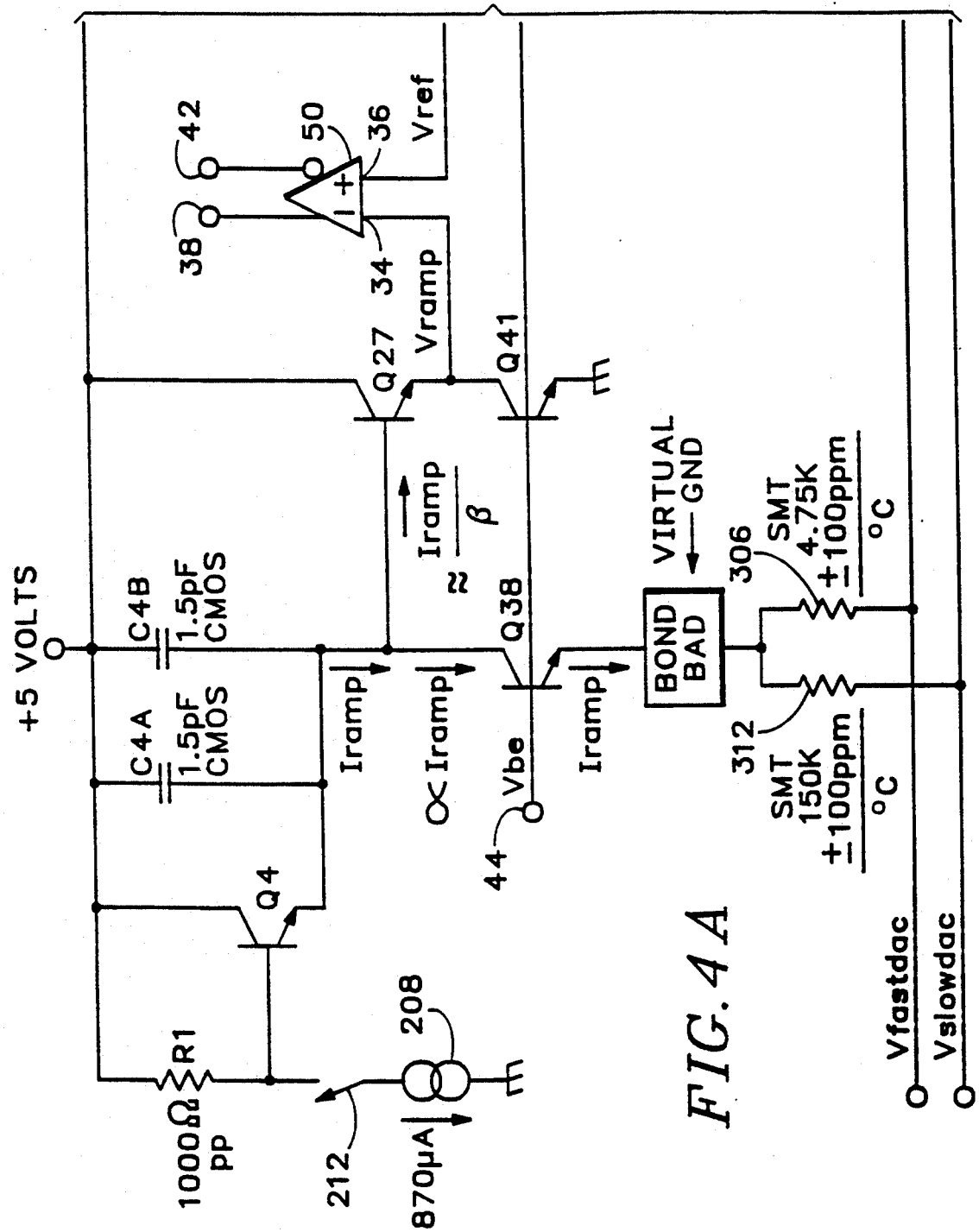
Figure 4B:
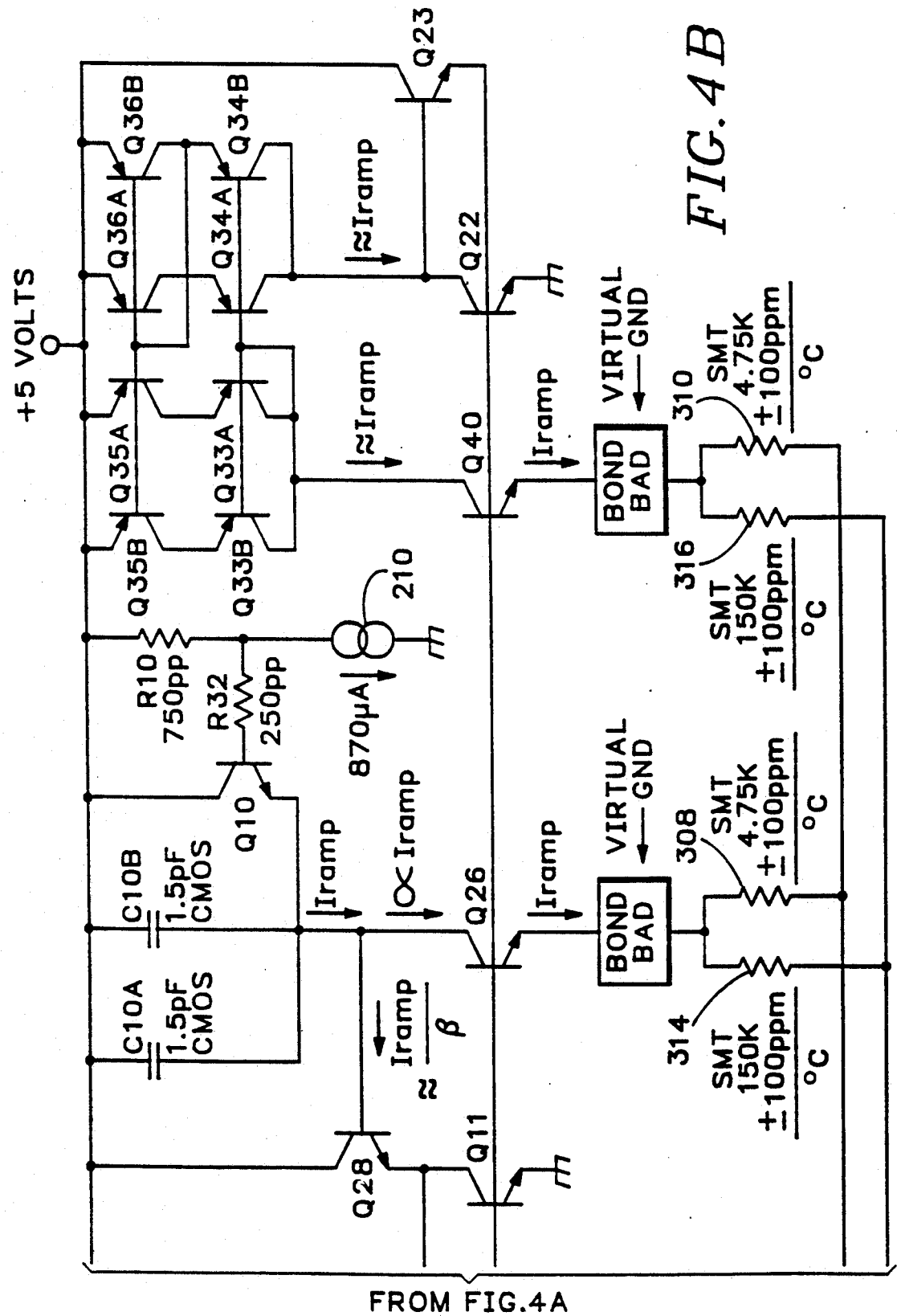

Still further detail of ramp generator 20 and voltage-to-current converter 30 is shown in FIG. 4. The base of transistor Q4 receives an input voltage provided by resistor R1 and switched current source 208. As explained above, the ramp voltage is at an initial steady state when switch 212 is open and the base of transistor Q4 is nearly equal to Vcc. The ramp is generated when switch 212 is closed and the base of transistor Q4 is equal to about 870 millivolts below Vcc. The collector of transistor Q4 is coupled to Vcc and the emitter receives a reference current equal to Iramp. Parallel capacitors C4A and C4B, each equal to 1.5 pF, are coupled between Vcc and the emitter of transistor Q4. The base of transistor Q27 provides the alpha correction current to the collector of transistor Q38. The collector of transistor Q27 is coupled to Vcc. The emitter of transistor Q27 supplies the ramp signal to the negative input 34 of the comparator 50. Transistors Q27 and Q38 supply a reference current approximately equal to Iramp. Note that the emitter of transistor Q41 is coupled to ground (not virtual ground) and therefore the reference current generated at the collector of transistor Q41 is not a precision reference current.

The precision reference voltage VREF is generated by a reference voltage source portion of ramp generator 20. The reference voltage generator includes transistors Q10 and Q28 and resistors R10 and R32. The base of transistor Q10 receives a fixed voltage having a value between the Vcc and Vcc minus 870 millivolts. The voltage at the base of transistor Q10 is substantially equal 650 millivolts, which is the value of current source 210 (870 μA) multiplied by the value of resistor R10 (750 ohms). Note that the total resistance of R10 and R32 is equal to the resistance of R1 and that current sources 208 and 210 are of equal value. This circuit configuration matches the ramp generator circuit and ensures that the voltage at the base of transistor Q28 with respect to Vcc is always three-quarters of the minimum voltage at the base of transistor Q27, regardless of temperature or semiconductor process variations. The collector of transistor Q10 is coupled to Vcc and the emitter receives a reference current from the collector of Q26. The base of transistor Q28 provides the alpha correction current to the collector of transistor Q26. The collector of transistor Q28 is coupled to Vcc. The emitter of transistor Q28 supplies VREF to the positive input 36 of comparator 50 and receives a reference current from the collector of transistor Q11. Parallel capacitors C10A and C10B do not operate dynamically, but are included to further improve the matching and symmetry of the ramp generator and the reference voltage circuits.

Current mirror 318 of FIG. 3 is replaced by PNP transistors Q33A/B-Q36A/B in FIG. 4. The PNP transistors are arranged in a modified Wilson current mirror configuration to accurately mirror the current at the input, which is the shorted collector and base of transistors Q33a and Q33b. Each transistor in the current mirror is doubled to increase the effective beta at higher operating currents. This is desirable if lateral PNP transistors are used for transistors Q33A/B-Q36A/B. A "helper transistor", Q23, is included to reduce the impedance at bias line 44 and to provide the necessary drive current for each transistor that is coupled to the bias line.

Thus, the voltage-to-current converter 30 supplies four reference currents proportional to ramp timing control voltages Vfastdac and Vslowdac at the collectors of transistors Q38, Q41, Q11, and Q26. These four reference currents are used to generate two final reference currents equal to Iramp that are used to generate a precision ramp signal and a precision reference voltage. The final reference currents are compensated for temperature, beta, and other semiconductor process variations.

The ramp generator circuit shown in FIG. 4 provides a ramp signal that has little distortion and is quickly reset. The small amount of distortion in the ramp signal is caused, in part, by a portion of the reference current, Iramp, flowing through transistor Q4. Specifically, the voltage on the base of transistor Q4 is approximately equal to Vcc and the voltage on the emitter of transistor Q4 is approximately equal to Vcc minus 870 millivolts in the initial steady state as discussed above. After the ramp signal is initiated, the voltage on the base of transistor Q4 quickly drops by 870 millivolts, such that the base-to-emitter voltage is approximately equal to zero volts. Therefore, all of the reference current, Iramp, is generated by discharging capacitor C4. As the ramp signal increases (more negative), the base-to-emitter voltage of transistor Q4 increases, and the fraction of Iramp that flows through transistor Q4 increases exponentially. By setting the reference voltage, VREF, at three-quarters of the voltage swing on the base of transistor Q4 (about 650 millivolts), the total error current flowing through transistor Q4 is limited to less than 0.1% of the reference current, Iramp, at the end of the ramp signal.

As explained above, the ramp signal is quickly reset due to the large base-to-emitter voltage across transistor Q4 when current source 208 is disconnected. However, additional time is required for the ramp generator circuit to completely settle. Therefore, once the ramp generator 20 is reset, the error in the next generated ramp signal is a function of the rearm time between the reset command and the request to generate the next ramp signal. Rearm time is dominated by the RC time constant of the sum of capacitors C4A and C4B (3 pF) divided by the transconductance of transistor Q4 (gm ≈ current/26 millivolts at room temperature). For example, if Iramp is equal to 2.5 μA, then rearm time is equal to C4/$g_m$, or (3 pF×26 millivolts)/2.5 μA, which is approximately equal to 30 nS.

The ramp error of the next ramp is affected by rearm time (the reset time allowed for the previous ramp). The ramp error for the next ramp for all ramps (2 nS to 1 μs) is given as a function of rearm time in the following table:

| Rearm time | Error in the next ramp |
|---|---|
| 1 nS | 35% |
| 5 nS plus 1% of ramp | 5% |
| 5 nS plus 5% of ramp | 2% |
| 10 nS plus 10% of ramp | 1% |

Figure 5:
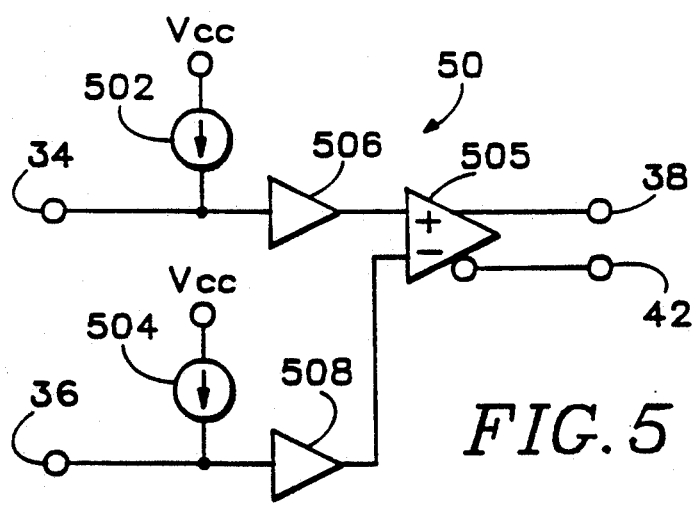
FIGS. 5-6 are block/schematic diagrams of the low input current comparator shown in FIG. 1.

Referring now to FIG. 5, comparator 50 is shown in more detail and includes a comparator stage 505 having a positive input, a negative input, and noninverting and inverting outputs for providing the end ramp signal. A first buffer stage 506 has an input forming the first input of comparator 50 and an output coupled to the positive input of the comparator stage 505. A second buffer stage 508 has an input forming the second input of the comparator 50 and an output coupled to the negative input of the comparator stage 505. The inputs of the first and second buffer stages have associated input currents that are cancelled by a first compensation current source 502 coupled to the input of the first buffer stage 506 and a second compensation current source 504 coupled to the input of the second buffer stage 508.

Figure 6:
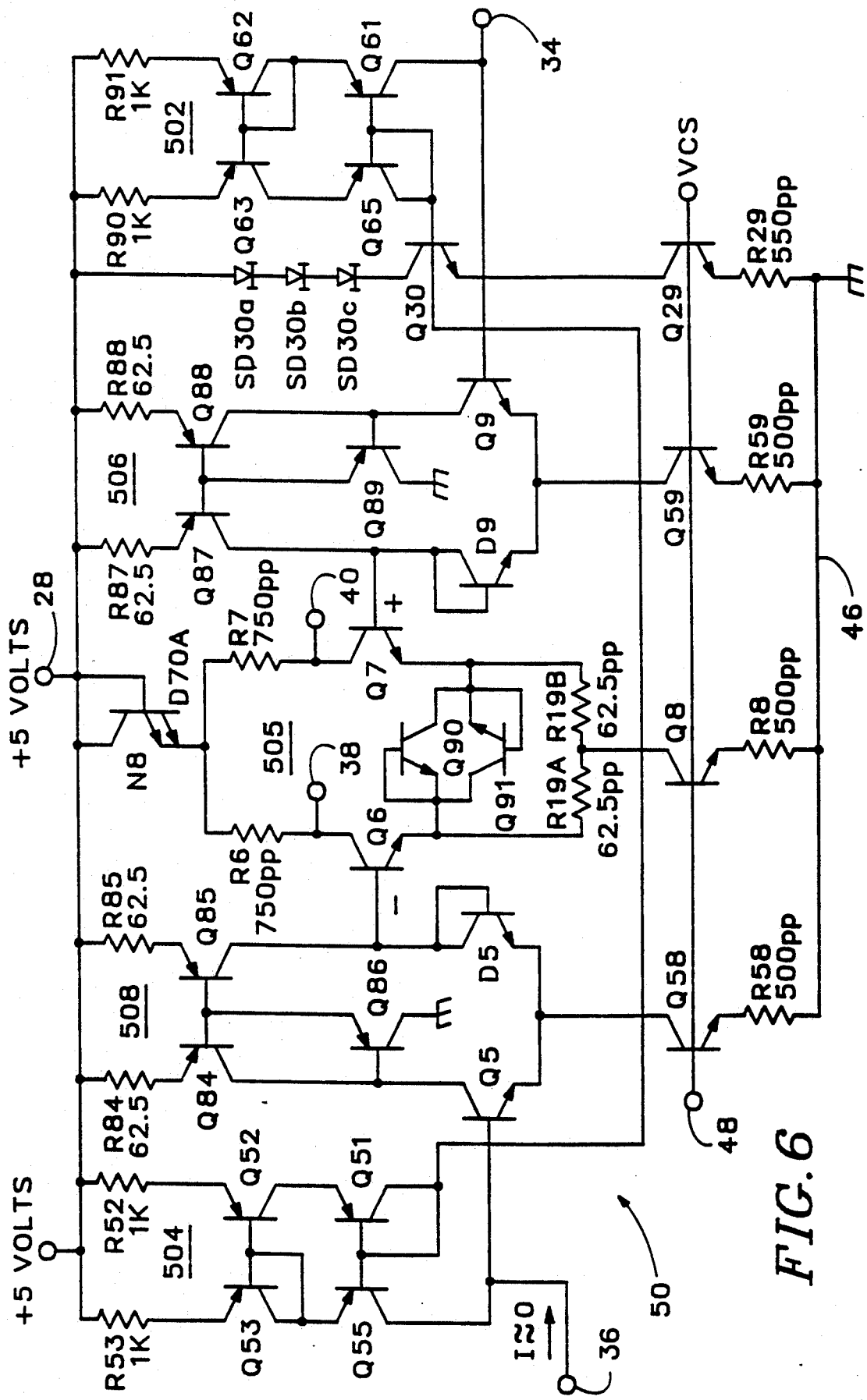

A more detailed schematic level diagram of comparator 50 is shown in FIG. 6. The comparator stage 505 is of conventional type having a differential input pair of transistors Q6 and Q7. The base of transistor Q7 is the positive input and the base of transistor Q6 is the negative input. Transistors Q90 and Q91 are used as capacitors (primarily the base-to-collector parasitic capacitance) to provide peaking at the outputs 38 and 40. Diode-connected transistor D70A coupled to load resistors R6 and R7 helps the collector-to-emitter voltages of transistors Q6 and Q7 to remain constant over temperature, thus reducing thermally induced errors.

The first buffer stage 506 and the second buffer stage 508 are identical and therefore only buffer stage 508 is described. Buffer stage 508 includes a transistor Q5, the base thereof forming the input, and a diode D5, the anode thereof forming the output. A bias current source provided by the collector of transistor Q58 is coupled to the emitter of transistor Q5 and the cathode of diode D5. A PNP current mirror Q84, Q85, Q86, R84, R85 has an input coupled to the collector of transistor Q5 and an output coupled to the anode of diode D5.

It is important to note that buffer stages 506 and 508 use one less NPN transistor than a prior art "three transistor" buffer stage. Buffer stages 506 and 508 do not have feedback from the negative input to the output as in the prior art buffer stage. The PNP current mirror allocates the bias current from transistor Q58 equally between transistor Q5 and diode D5. Thus, the base-to-emitter voltage of transistor Q5 is approximately equal to the voltage across diode D5, and therefore there is substantially no voltage differential between input and output.

The input current of buffer stages 506 and 508 is cancelled to minimize errors in the ramp signal and the reference voltage, VREF. The correction current is provided by PNP current mirrors 502 and 504, and transistor Q30. Equal bias currents for transistor Q30, buffer stages 506 and 508, and comparator stage are provided by the collectors of transistors Q29, Q59, Q58, and Q8. Therefore, the current in the base of transistor Q30 tracks the current in the base of transistors Q5 and Q9 with respect to temperature, transistor beta, and semiconductor process variations. The base current of transistor Q30 is mirrored and added to the base currents of transistors Q5 and Q9 to provide input currents that are substantially cancelled.

Figure 7:
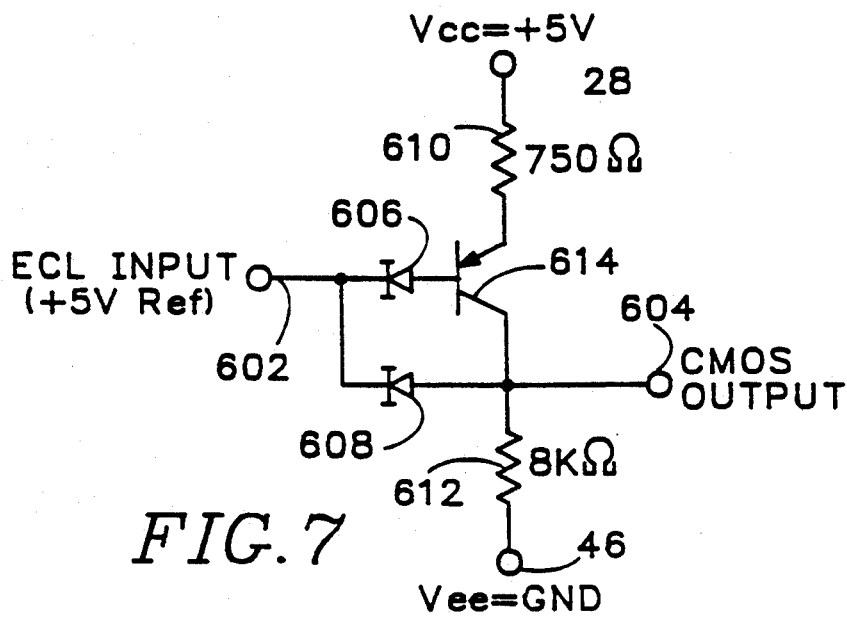
FIG. 7 is a schematic diagram of the ECL-to-CMOS converter circuit shown in FIG. 1.

Referring now to FIG. 7, an ECL-to-CMOS converter 60 includes first 606 and second 608 Schottky diodes having coupled cathodes for receiving an ECL level input at terminal 602. A PNP transistor 614 has a base coupled to the anode of the first Schottky diode 606 and a collector for providing a CMOS level output at terminal 604. A first resistor 610 is coupled between the emitter of the PNP transistor 614 and Vcc. A second resistor 612 is coupled between the collector of the PNP transistor 614 and Vee or ground. In operation, ECL-to-CMOS converter 60 provides an inverted output. A logic high at the input terminal 602 turns off PNP transistor 614, which couples output terminal 604 to ground or Vee through resistor 612. A logic low at the input terminal 602 turns on PNP transistor 614, producing a voltage drop across resistor 612. The voltage at the output terminal 604 is about four volts. Transistor 614 is prevented from saturating by the clamping action of Schottky diodes 606 and 608.

Figure 9:
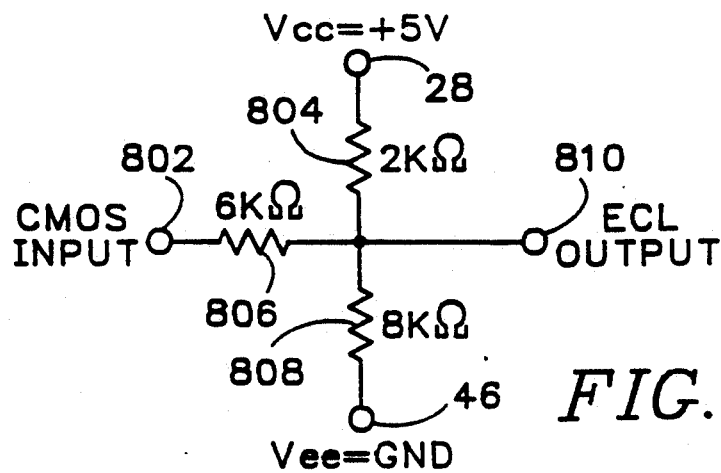
FIG. 9 is a schematic diagram of a CMOS-to-ECL converter circuit shown in FIG. 1.

Referring to FIG. 9, a CMOS-to-ECL converter 90 includes a first resistor 806 coupled between a CMOS level input terminal 802 and an ECL level output terminal 810. A second resistor 804 is coupled between the ECL level output terminal 810 and Vcc, and a third resistor 808 is coupled between the ECL level output terminal 810 and Vee or ground. Appropriate selection of resistor values as shown produces a simple, noninverting CMOS level to ECL level translation.

Figure 8:
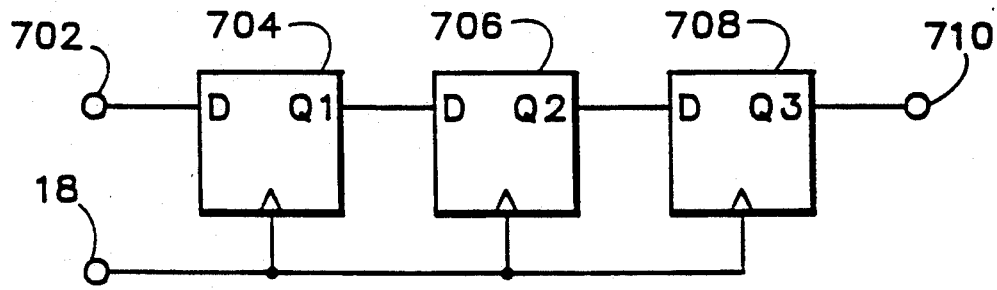
FIG. 8 is a schematic diagram of a three stage synchronizer circuit shown in FIG. 1.

Referring to FIG. 8, a flip-flop synchronizer circuit 70 includes three D-type flip-flops coupled in series with the first input 21 of the CMOS counter circuit 80. Synchronizer circuit 70 minimizes metastable (invalid) logic states due to the edge of the clock signal on the clock input 18 occuring at the same time that the end of ramp signal at input 21 changes logic state. Therefore, D-type flip-flops 704-708 are arranged in series with the Q output being coupled to the D input of the next stage. Statistically, most metastable signals received at input 702 are resolved into valid logic states by being subsequently clocked through the three flip-flops 704-708. The operation of synchronizer 70 is known in the art and more fully described in an article "Metastable Behavior in Digital Systems" that appeared in the December 1987 issue of the IEEE Design & Test of Computers, pp. 4-19, which is hereby incorporated by reference.

Figure 10:
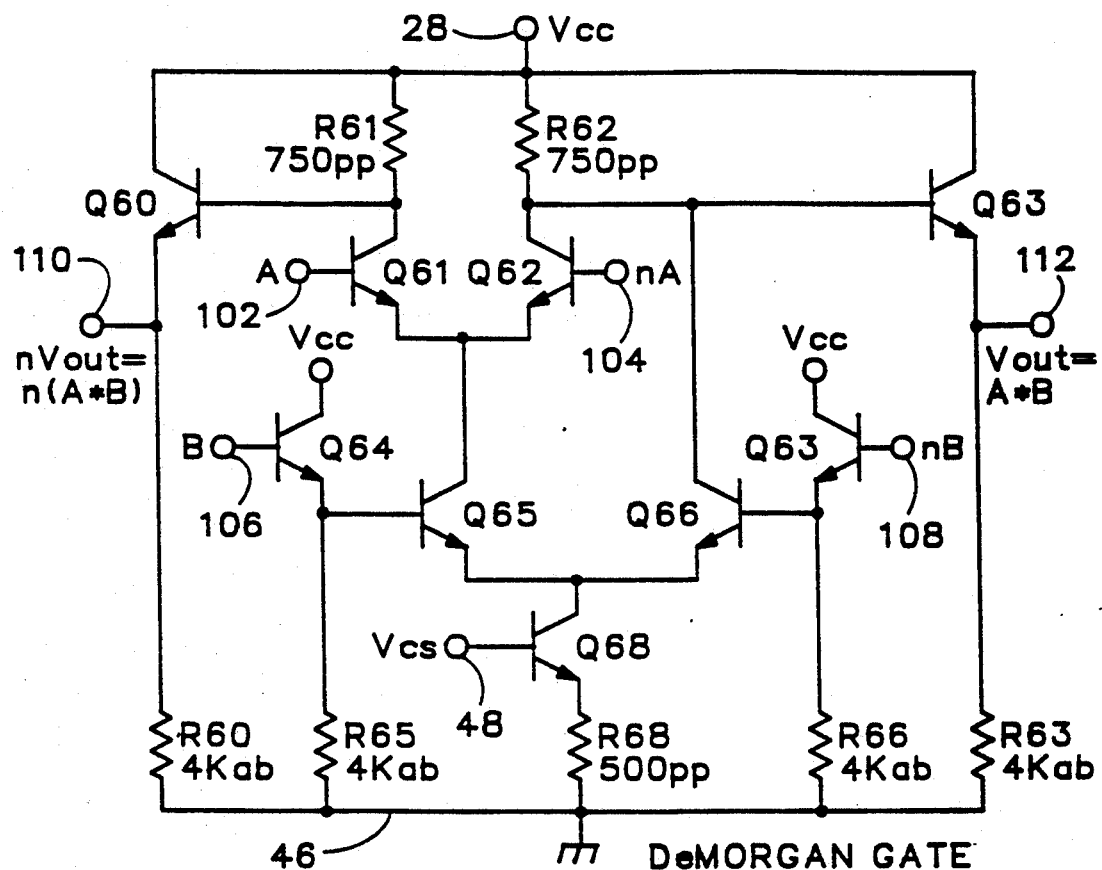
FIG. 10 is a schematic diagram of a general purpose "DeMorgan Gate" suitable for use in the present invention.

A general purpose "DeMorgan Gate" is shown in FIG. 10, which is suitable for use as any AND or OR gate described herein such as AND gate 100 of FIG. 1. The DeMorgan gate has noninverting A and B input terminals 102 and 106, inverting A and B input terminals 104 and 108, noninverting output terminal 112, and inverting output terminal 110.

Figure 11:
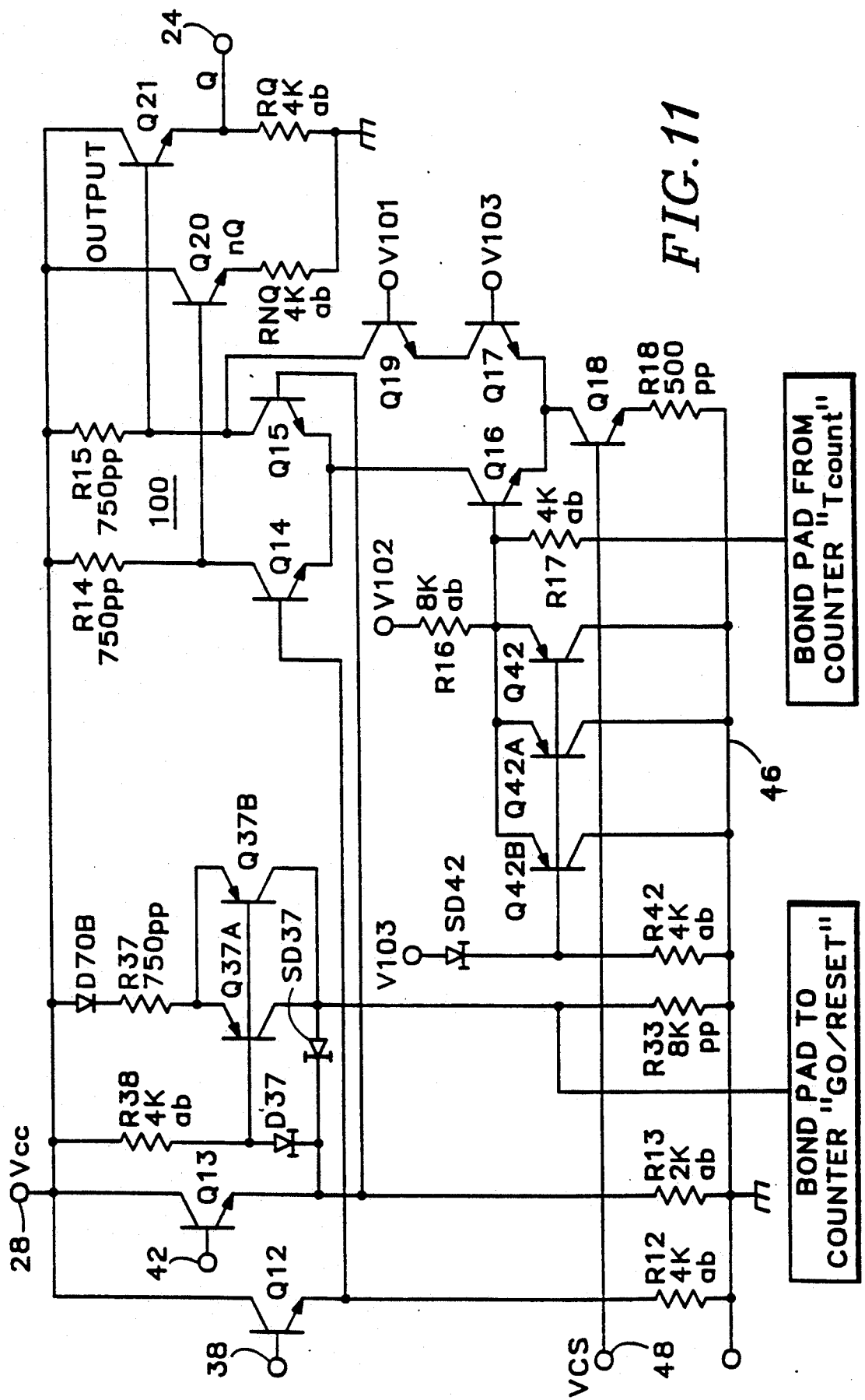
FIG. 11 is a schematic diagram of the AND gate and associated converter circuits of FIG. 1 integrated together in a practical form.

The AND gate 100 and associated output circuitry is shown in a practical integrated implementation in FIG. 11. AND gate 100 includes transistors Q14-Q21 and resistors R14, R15, R18, RNQ, and RQ. The base of transistor Q14 forms the input coupled to the positive output of comparator 50. The base of transistor Q16 forms the other input coupled to the output of CMOS-to-ECL converter 90. The output of AND gate 100 is provided by the emitter of transistor Q21. Bias voltages V101, V102, and V103 are provided by a bias cell that is described below. The CMOS level Tcount provided by CMOS counter 80 is attenuated by resistors R16 and R17. (The CMOS-to-ECL converter of FIG. 9 is slightly modified in FIG. 11 to generate an appropriate DC bias at the AND gate input.) The voltage at the base of transistor Q16 is clamped by transistors Q42, Q42A, Q42B, diode SD42, and resistor R42 to prevent saturation of transistor Q16. Transistors Q12 and Q13 are single transistor buffers that buffer the outputs 38 and 42 of comparator 50. The negative output 42 of comparator 50 is converted from an ECL level to an inverted CMOS level by converter circuitry including transistors Q37a and Q37b, resistors R37 and R38, and diodes D37, SD37, and D70B. (The ECL-to-CMOS converter of FIG. 7 is slightly modified by the addition of D70B, such that the switching threshold of the converter thermally tracks the output of comparator store 505.)

Figure 12:
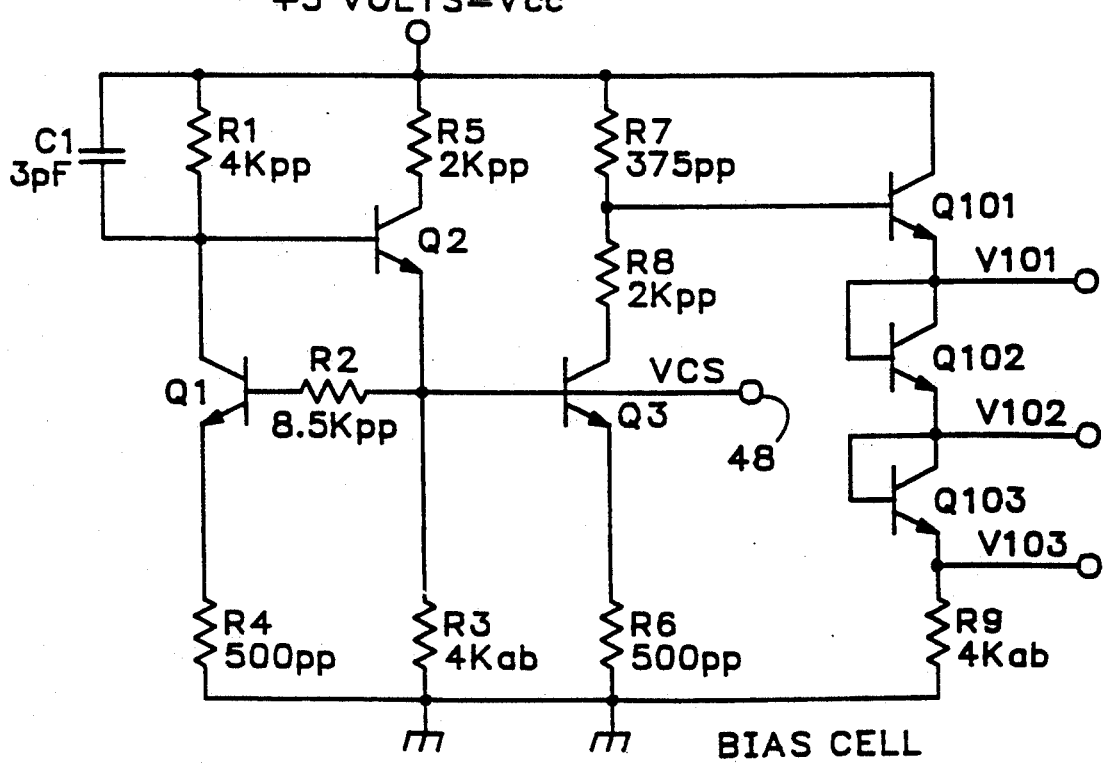
FIG. 12 is a schematic diagram of a bias cell suitable for use in the present invention.

The bias cell shown in FIG. 12 is used to generate nonprecision voltages Vcs, V101, V102, and V103. Resistor R1 sets the current flow through transistors Q1 and Q3. Transistor Q2 is a helper transistor that drives the bases of transistors Q1 and Q3. The frequency stability of the bias cell is improved by the addition of capacitor C1 from Vcc to the base of transistor Q2. Transistor beta error correction is provided by resistor R2.

Nominal values for the resistors and capacitors in drawing FIGS. 2-12 are printed with the circuit element designation. In addition, the type of resistor material (ab=active base, pp=enhanced p-type) is also printed. The nominal values and resistor types are used for purpose of this circuit example only and are not intended to be limiting of the basic design or operation of the timer circuit 10 shown in FIG. 1.

Choosing the Maximum Ramp Time Interval

In the preferred embodiment the maximum ramp time interval or break-over point between ramp only operation and ramp plus counter operation is set to 1 μs. Several factors are taken into account to arrive at this value.

Although the current sources and other ramp circuitry can provide a ramp signal much greater than 1 μs, the resolution of the DAC circuits is limited. Referring to FIG. 3, about 330 mV appears at the output of DAC 404 and across resistors 312, 314, and 316 to generate a ramp current of about 2.2 μA, which produces the 1 μs ramp time interval. The 330 mV represents 117 discrete levels of the DAC 404, or a resolution of about 0.85% Generating a ramp time interval much greater than 1 μs causes significant quantization errors above 1% (10 ns equivalent).

Reducing the maximum ramp signal to a time interval less than 1 μs is possible, but this leads to increased fractional errors due to the synchronization jitter of the CMOS counter. Under fixed conditions, the analog ramp signal is generally more stable (i.e., has less jitter) than the digital CMOS counter. The analog ramp has about 1% jitter, while the CMOS counter has roughly 20 ns of synchronization jitter. The CMOS counter jitter is fixed in absolute value, but decreases as a percentage as the time value programmed is increased. The analog ramp jitter is fixed as a percentage but increases absolutely as the time value programmed is increased. Thus, the analog ramp has less absolute jitter for faster settings (less time programmed) and the CMOS counter has less fractional jitter for slower settings (more time programmed). Likewise, the analog ramp has more absolute jitter at slow settings and the CMOS counter has more fractional jitter at fast settings. Therefore, to optimize jitter the maximum ramp time interval is set such that the jitter of the selected maximum ramp time interval is equal to the jitter of an equivalent time interval provided by the CMOS counter.

While the analog ramp and CMOS counter jitter are major factors in choosing the maximum ramp time interval, other factors such as temperature drift and jitter added by the ECL to CMOS conversion circuitry at slow settings should be considered. Assuming the ECL to CMOS conversion adds another 20 ns of jitter to the total, it would seem that the maximum ramp time interval should be increased to maintain 1% fractional jitter for all time settings. However, a longer ramp also increases absolute error. For example, the ramp can drift by as much as 5% with temperature, while the CMOS counter does not drift to this extent. Therefore, increasing the ramp to improve worst case fractional jitter also increases worst case absolute DC temperature drift.

Ultimately, the choice of the 1 μs maximum ramp time interval is a compromise between worst case absolute accuracy and worst case fractional jitter.

Monotonicity and Choosing a Fixed Ramp Time Interval

A desirable characteristic of any timing system is that the delay time provided should monotonically increase from the fast settings to the slow settings. Thus, if the analog ramp is used for time settings less than 1 μs, and a fixed analog ramp and the CMOS counter for settings greater than 1 μs, it is expected that the 1 μs time interval is less than the next greater time interval, 1.02 μs (1 μs plus one 20 ns clock cycle). The difference in the two settings need not be exactly positive 20 ns, but a negative difference is highly undesirable.

Monotonicity over temperature between the settings above and below the maximum ramp time interval is a concern because the CMOS counter usually has a stable clock frequency and does not drift with temperature, while the analog ramp can vary as much as 5% for a 50° C. rise in temperature. Therefore, if a 1 μs ramp varies ±5% over temperature, the maximum ramp time interval varies by ±50 ns.

The maximum ramp time interval is determined as the cross-over point between the analog ramp and the analog ramp plus the CMOS counter. Therefore, at longer time intervals the programmed time is provided by a fixed analog ramp and the remainder by the CMOS counter. If the fixed analog ramp is made too short, monotonicity errors can occur. For example, at the worst case the analog ramp can be 1.05 μs for a selected time setting of 1 μs. Assuming a fixed analog ramp of 80 ns, just long enough for the CMOS counter to settle, the next incremental time setting including the CMOS counter is 1.02 μs. Further assuming for this example that the errors in the short fixed analog ramp are negligible compared with the absolute error of the 1 μs analog ramp, an undesirable negative difference of about 30 ns occurs between time settings.

It is therefore desirable that the fixed analog ram be longer than the minimum required for resetting the CMOS counter. A fixed analog ramp of about 900 ns improves monotonicity because the fixed ramp tracks the maximum ramp time interval over temperature. Using the worst case temperature, the analog ramp at the 1 μs setting still yields 1.05 μs. However, the 900 ns fixed analog ramp similarly changes with temperature to a time of 945 ns. The CMOS counter is programmed for the remainder of 120 ns for the 1.02 μs time setting. The worst case total time, using the 900 ns fixed analog ramp, is therefore 945 ns+120 ns=1.065 μs. The difference between the two time settings is thus 1.065 μs−1.05 μs=15 ns. (Neglecting any temperature drift in the ECL-to-CMOS conversion.) Although the difference is not a perfect 20 ns, it is positive and the transition between time settings is monotonic.

An even larger 1 μs fixed ramp provides perfect monotonicity between time settings. However, due to the synchronizer circuitry, the CMOS counter has a minimum count of four clock cycles. Therefore the fixed ramp cannot be greater than the difference between the maximum ramp time interval and four clock cycles.

The fixed analog ramp time interval desirably includes any delay from the ECL to CMOS conversion circuitry. For example, if the conversion circuitry has a total delay of 160 ns, the fixed ramp is set to 740 ns for a total of 900 ns.

APPLICATIONS

The timer circuit 10 of the present invention is suited for any general timer circuit application, but is particularly well suited for pulse width discrimination. This is primarily due to the ability of the timer circuit 10 to quickly reset, to provide a Wide range of substantially accurate time intervals starting at a few nanoseconds, and to resolve time intervals on the order of 500 picoseconds at faster time settings.

Figure 15:
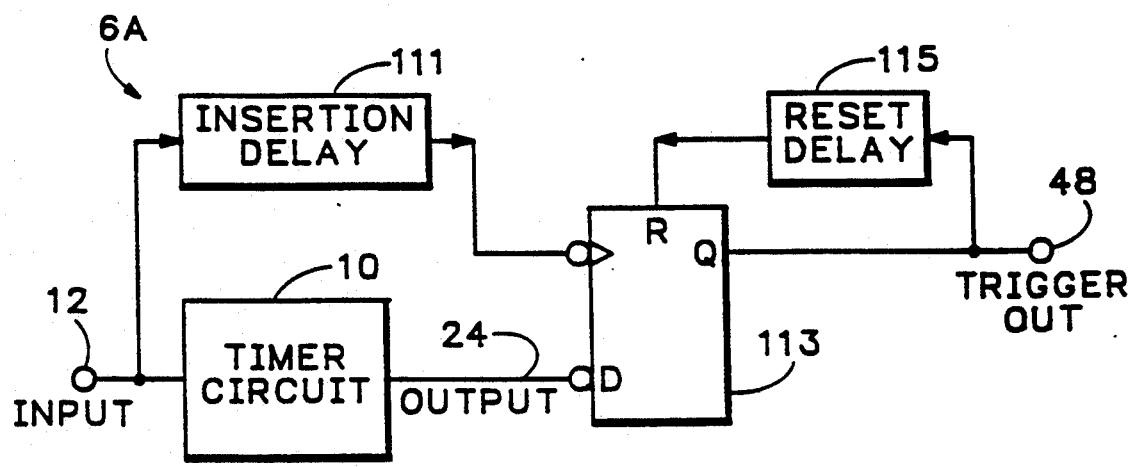
FIG. 15 is a schematic diagram of a glitch trigger circuit employing the timer circuit of the present invention.

A glitch trigger circuit 6A is shown in FIG. 15 for discriminating pulses less than a predetermined time interval determined by the timer circuit 10. The glitch trigger circuit output provides a trigger output signal if an input signal is detected having a pulse width less than the predetermined time interval. The glitch trigger circuit 6A includes a timer circuit 10 and D-type flip-flop 113. The flip-flop 113 has a first inverted clock input for receiving the input signal and a second inverted D input for receiving the output signal of the timer circuit 10 which is delayed by the predetermined time interval. The Q output of the flip-flop provides the trigger signal.

Figure 16:
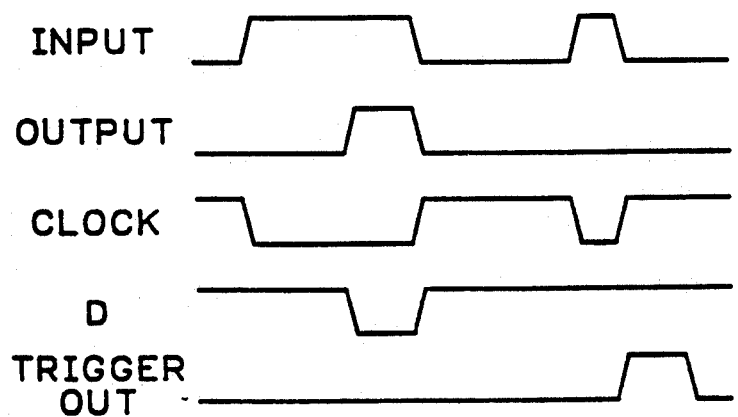
FIG. 16 is a timing diagram illustrating the operation of the glitch trigger circuit of FIG. 15.

The operation of the glitch trigger circuit 6A is shown in the timing diagram of FIG. 16. The INPUT signal is shown as a sequence of a long pulse that does not produce a trigger signal, followed by a short pulse that does produce the trigger signal. The first, rising edge of the INPUT signal starts the timer circuit 10 and the second, falling edge of the INPUT signal is the end of the pulse, which may or may not occur before the selected time interval has expired. If the time interval has expired before the pulse ends, as in the first portion of the timing diagram, the timer circuit OUTPUT is momentarily high while the INPUT signal resets to a logic low. Since the clock input of the flip-flop 113 is inverted, the output of the flip-flop is clocked at the falling edge of the INPUT signal. A logic high at the timer circuit output provides a logic low at the D input of the flip-flop 113, and a logic low is clocked to the TRIGGER OUT. However, in the second portion of the timing diagram, the INPUT signal is a pulse that is less than the time interval selected for the timer circuit. The timer circuit output never reaches a logic high state, and thus a logic high is present on the D input at the falling edge of the INPUT pulse. Therefore, a logic one is clocked to the TRIGGER OUT, which is the trigger signal representing that a pulse less than the predetermined time interval has occurred.

The glitch trigger circuit 6A further includes an insertion delay path 111 for delaying the input signal to the first inverted input of the D-type flip-flop 113 by an amount not greater than the characteristic reset time of the timer circuit 10. The insertion delay is desirable for discrimination of extremely short input signal pulses. The ability of the glitch trigger circuit 6A to discriminate extremely short input signal pulses is compromised if the reset time of the time circuit 10 is on the same order as the input signal pulse. Therefore, an insertion delay is added that is slightly less than the characteristic reset time of the timer circuit 10. The insertion delay cannot be equal to the reset time, because some hold time is required for the flip-flop 113. In addition, invalid metastable states can occur if the insertion delay is set too closely to the reset time of the timer circuit 10.

The glitch trigger circuit 6A also includes a reset delay 115 for coupling a delayed trigger signal to the asynchronous reset input of the flip-flop 113. Without the reset delay, the glitch trigger circuit 6A latches the first occurrence of an input pulse less than the predetermined time interval. With the addition of the reset delay 115, the glitch trigger circuit 6A provides a trigger output pulse for counting each occurrence of the input pulse less than the predeterimed time interval. The width of the trigger output pulse is slightly greater than the reset delay.

Figure 17:
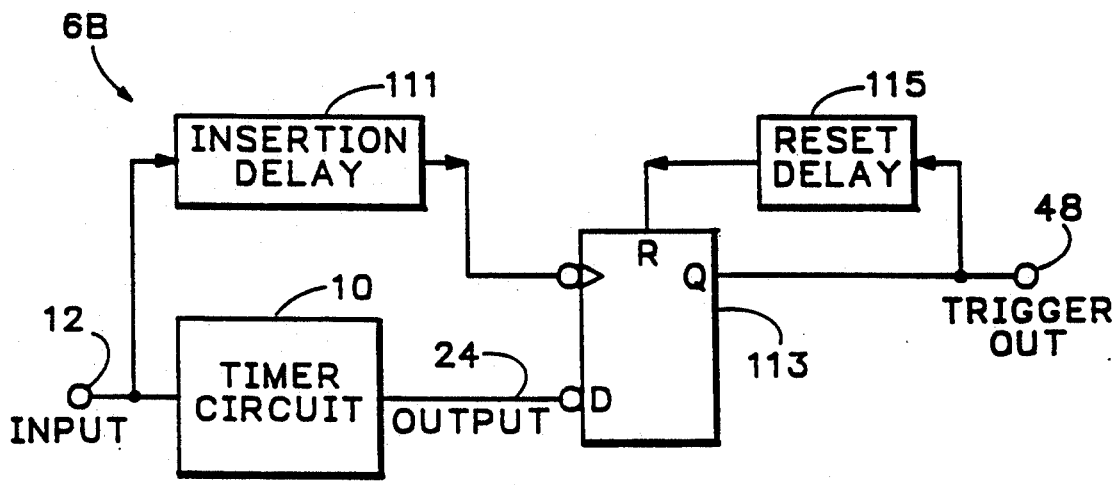
FIG. 17 is a schematic diagram of a glitch filter circuit employing the timer circuit of the present invention.

A glitch filter circuit 6B is shown in FIG. 17 that includes the same elements as the glitch trigger circuit 6A of FIG. 16. The notable difference is that the D input of the flip-flop 113 is non-inverted. Therefore the trigger output 48 provides a trigger signal upon detection of an input signal having a pulse width greater than a predetermined time interval set by the timer circuit 10.

Figure 18:
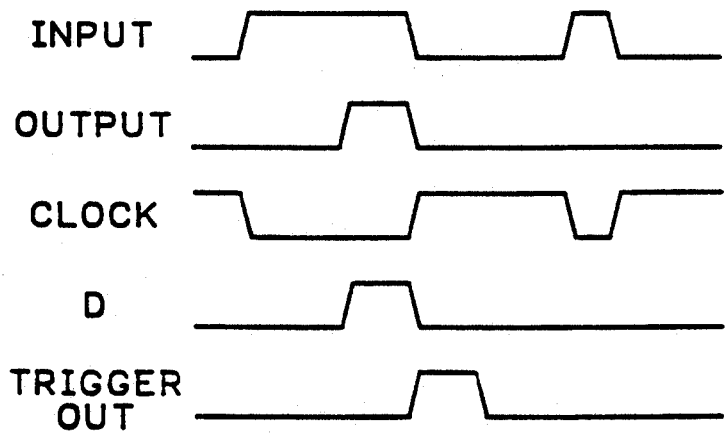
FIG. 18 is a timing diagram illustrating the operation of the glitch filter circuit of FIG. 17.

The operation of the glitch filter circuit 6B is shown in the timing diagram of FIG. 18. Note that the INPUT, OUTPUT, and CLOCK signals are identical, but that the D signal is inverted from the D signal in the timing diagram of FIG. 16. The non-inverting D input receives a logic high at the falling edge of the INPUT signal, which then clocks a logic high to the output of the flip-flop 113. Conversely, a short input pulse provides a logic low at the output of the timer circuit at the falling edge of the input signal, which then clocks a logic low to the output of the flip-flop 113.

The glitch filter circuit 6B includes an insertion delay 111 as in the glitch trigger circuit 6A for improving short pulse discrimination. The glitch filter circuit 6B also includes a reset delay 115 for providing the trigger output pulse counting function.

Figure 19:
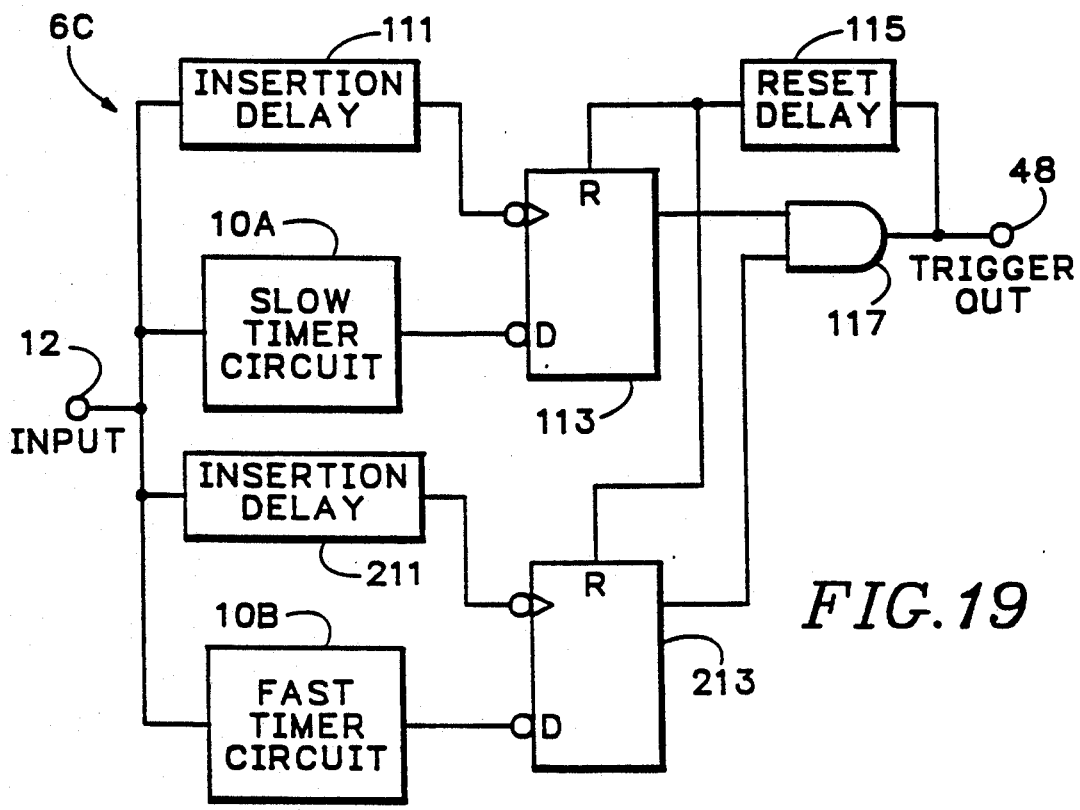
FIGS. 19-22 are schematic diagrams of alternative embodiment trigger circuits using the timer circuit of the present invention.

A trigger circuit 6C in FIG. 19 includes a first, slow timer circuit 10A and a second, fast timer circuit 10B. The designations "slow" and "fast" in FIGS. 19 and 20 refer to the longer and shorter time intervals selected for timer circuits 10A and 10B. A first D-type flip-flop 113 has an inverted clock input for receiving the input signal, an inverted D input for receiving the output signal of the first timer circuit, and a Q output. A second D-type flip-flop 213 has an inverted clock input for receiving the input signal, a non-inverted D input for receiving the output signal of the second timer circuit, and an output. An AND gate 117 has first and second inputs respectively coupled to outputs of the first and second flip-flops and an output. The output provides a trigger signal upon detection of an input signal having a pulse width greater than a time interval determined by the second, fast timer circuit and less than a time interval determined by the first, slow timer circuit. The trigger function of trigger circuit 6C is also known as triggering on a pulse width within limits.

Figure 20:
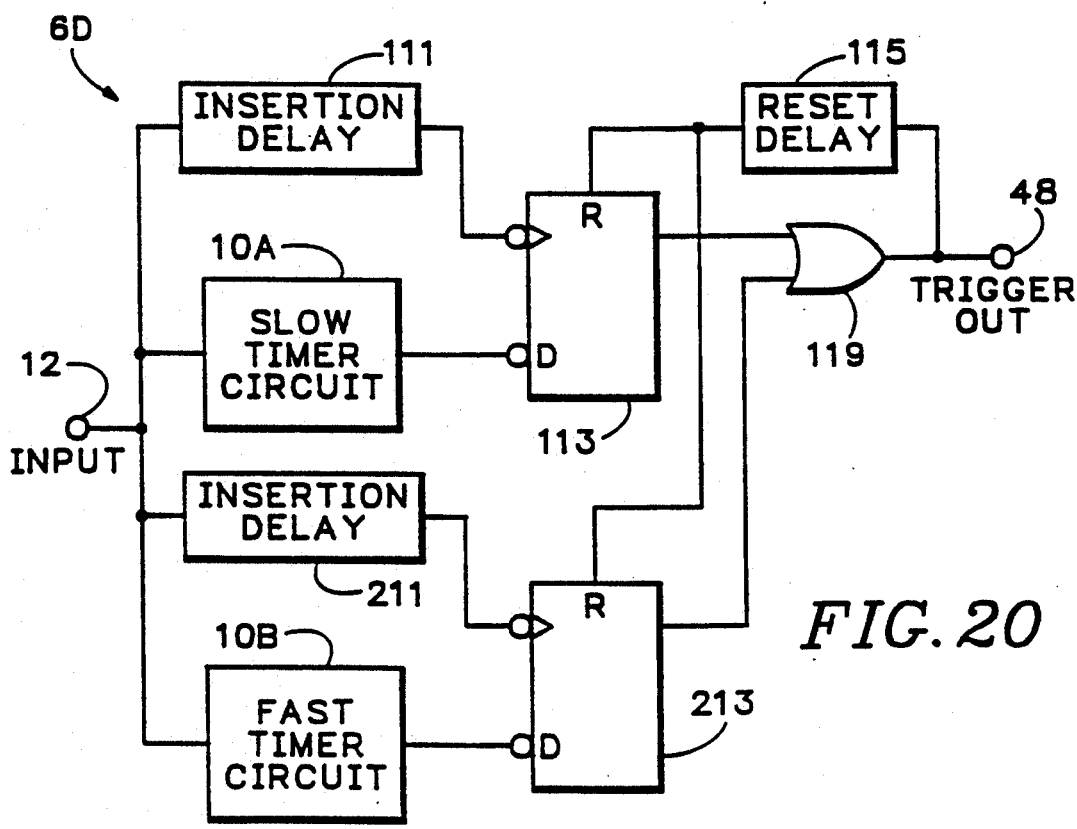

The trigger circuit 6D shown in FIG. 20 is similar to the trigger circuit 6C of FIG. 19. Notable differences include a non-inverting D input on the first flip-flop 113, and an inverting D input on the second flip-flop 213. Trigger circuit 6D also includes an OR gate 119 having first and second inputs respectively coupled to outputs of the first and second flip-flops. The output 48 provides a trigger signal upon detection of an input signal having a pulse width less than a time interval determined by the second, fast timer circuit 10B or greater than a time interval determined by the first, slow timer circuit 10A. The trigger function of trigger circuit 6D is also known as triggering on a pulse width outside of limits.

Trigger circuits 6C and 6D each include a first insertion delay 111 and a second insertion delay 211 for delaying the input signal to the inverted clock inputs of the first flip-flop 113 and the second flip-flop 213. Trigger circuits 6C and 6D also each include a reset delay 115 for providing the counting function.

Figure 21:
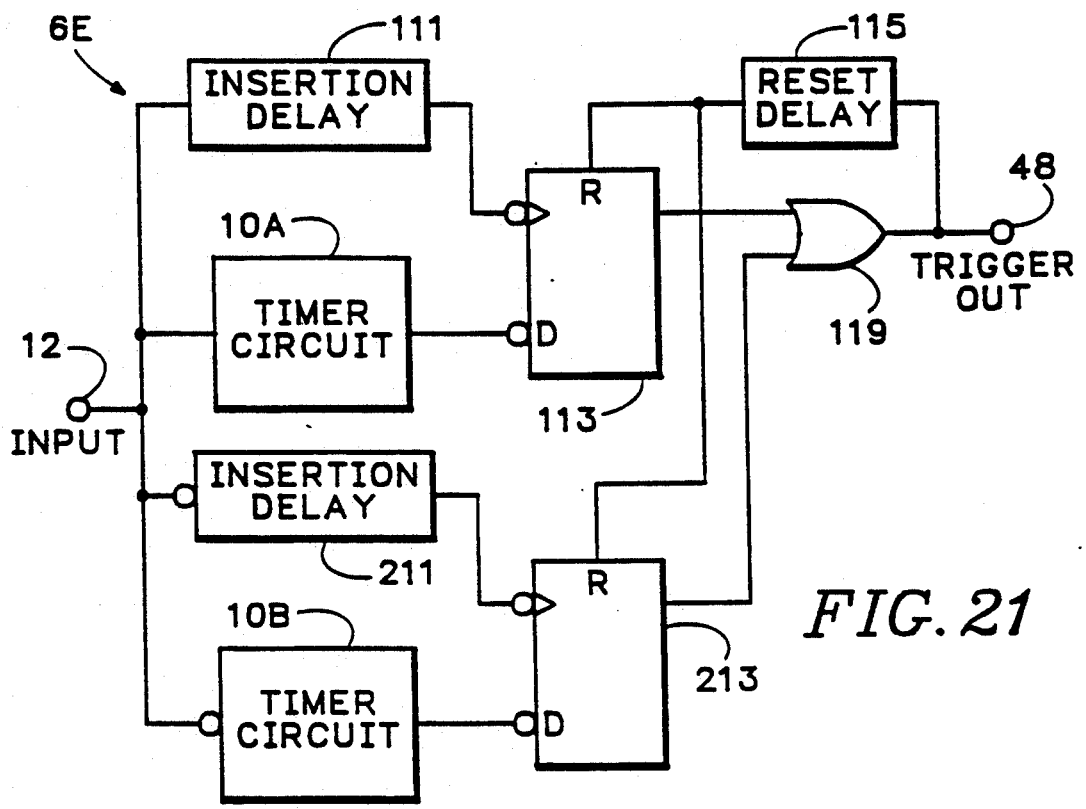

Trigger circuit 6E shown in FIG. 21 (also known as a bipolar glitch trigger) is essentially a combination of a non-inverted and an inverted glitch trigger circuit 6A. The non-inverted glitch trigger circuit searches for positive-going glitches, while the inverted glitch trigger circuit searches for negative-going glitches. It is important to note that the two individual glitch trigger circuits are independent. Therefore, a trigger signal is produced if an input pulse of a first polarity has a pulse width less than the time interval of timer circuit 10A or if an input of a second polarity has a pulse width less than the time interval of timer circuit 10B. If desired, the bipolar glitch detector 6E, can include the insertion delay 111, 211, and the reset delay 115 of the previous trigger circuits.

Figure 22:
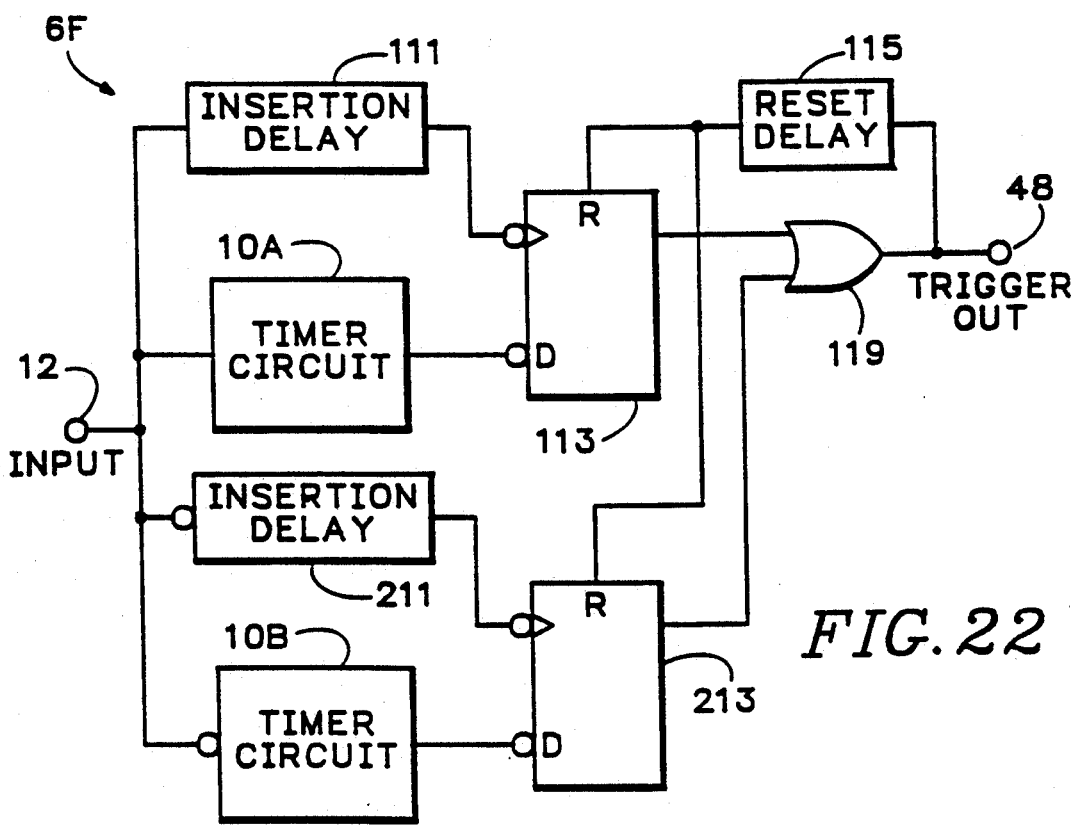

Trigger circuit 6F shown in FIG. 22 (also known as a bipolar glitch filter) is essentially a combination of a non-inverted and an inverted glitch filter circuit 6B. The non-inverted glitch filter circuit searches for positive-going input pulses, while the inverted glitch trigger circuit searches for negative-going input pulses. Again, the two individual glitch filter circuits are independent. Therefore, a trigger signal is produced if an input pulse of a first polarity has a pulse width greater than the time interval of timer circuit 10A or if an input of a second polarity has a pulse width greater than the time interval of timer circuit 10B. If desired, the bipolar glitch filter 6F, can include the insertion delay 111, 211, and the reset delay 115 of the previous trigger circuits.

While we have shown and described preferred embodiments of our invention, it is apparent to those skilled in the art that many changes and modifications can be made without departing from the invention in its broader aspects. The appended claims therefore cover all such changes and modifications as fall therewithin.

We claim:

1. A glitch trigger circuit (6A) comprising:
   (a) a timer circuit (10) including
      means (20) for generating a ramp signal upon the command of an input signal,
      means (50) for generating an end of ramp signal when the ramp signal reaches a predetermined magnitude, wherein the difference in time between the end of ramp signal and the input signal defines a first time interval,
      means (80) for counting initiated by the end of ramp signal and producing a terminal count signal when a predetermined number of clock cycles have been counted, wherein the predetermined number of cycles defines a second time interval, and
      means (100) for providing an output signal that is responsive to the end of ramp signal and the terminal count signal and is accordingly delayed from the input signal by a total time interval substantially equal to the sum of the first and second time intervals; and
   (b) a flip-flop (113) having a first inverted input for receiving the input signal, a second inverted input for receiving the output signal, and an output for providing a trigger signal upon detection of an input signal having a pulse width less than a predetermined time interval.

2. A glitch trigger circuit (6A) as in claim 1 further comprising means (111) for delaying the input signal to the first inverted input of the flip-flop by an amount not greater than a characteristic reset time of the timer circuit.

3. A glitch trigger circuit (6A) as in claim 1 in which the flip-flop includes a reset input, and the glitch trigger circuit further comprises means (115) for coupling a delayed trigger signal to the reset input.

4. A glitch filter circuit (6B) comprising:
   (a) a timer circuit (10) including
      means (20) for generating a ramp signal upon the command of an input signal, means (50) for generating an end of ramp signal when the ramp signal reaches a predetermined magnitude, wherein the difference in time between the end of ramp signal and the input signal defines a first time interval, means (80) for counting initiated by the end of ramp signal and producing a terminal count signal when a predetermined number of clock cycles have been counted, wherein the predetermined number of cycles defines a second time interval, and means (100) for providing an output signal that is responsive to the end of ramp signal and the terminal count signal and is accordingly delayed from the input signal by a total time interval substantially equal to the sum of the first and second time intervals; and (b) a flip-flop (113) having a first inverted input for receiving the input signal, a second non-inverted input for receiving the output signal, and an output for providing a trigger signal upon detection of an input signal having a pulse width greater than a predetermined time interval.

5. A glitch filter circuit (6B) as in claim 4 further comprising means (111) for delaying the input signal to the first inverted input of the flip-flop by an amount not greater than a characteristic reset time of the timer circuit.

6. A glitch filter circuit (6B) as in claim 4 in which the flip-flop includes a reset input, and the glitch filter circuit further comprises means (115) for coupling a delayed trigger signal to the reset input.

7. A trigger circuit (6C, 6D, 6E, 6F) comprising:
(a) first and second timer circuit (10A, 10B), each timer circuit including
  means (20) for generating a ramp signal upon the command of an input signal,
  means (50) for generating an end of ramp signal when the ramp signal reaches a predetermined magnitude, wherein the difference in time between the end of ramp signal and the input signal defines a first time interval,
  means (80) for counting initiated by the end of ramp signal and producing a terminal count signal when a predetermined number of cycles defines a second time interval, and
  means (100) for providing an output signal that is responsive to the end of ramp signal and the input signal by a total time interval substantially equal to the sum of the first and second time intervals;
(b) a first flip-flop (113) having a first input for receiving the input signal, a second input for receiving the output signal of the first timer circuit, and an output;
(c) a second flip-flop (213) having a first input for receiving the input signal, a second input for receiving the output signal of the second timer circuit, and an output; and
(d) logic means (117, 119) having first and second inputs respectively coupled to the outputs of the first and second flip-flops and an output for providing a trigger signal.

8. A trigger (6C) as in claim 7 in which the first timer circuit (10A) comprises a slow timer circuit programmed for a relatively longer time interval, the second timer circuit (10B) comprises a fast timer circuit programmed for a relatively shorter time interval, the first and second inputs of the first flip-flop (113) each comprise inverted inputs, the first input of the second flip-flop (213) comprises an inverted input, and the logic means (117) comprises an AND gate for providing a trigger signal upon detection of an input signal having a pulse width greater than the relatively shorter time interval determined by the second, fast timer circuit and less than the relatively longer time interval determined by the first, slow timer circuit.

9. A trigger circuit (6C) as in claim 8 further comprising:
  first means (111) for delaying the input signal to the first inverted input of the first flip-flop by an amount not greater than a characteristic reset time of the first timer circuit; and
  second means (211) for delaying the input signal to the first inverted input of the second flip-flop by an amount not greater than a characteristic reset time of the second timer circuit.

10. A trigger circuit (6C) as in claim 8 in which the first and second flip-flops each include a reset input, and the trigger circuit further comprises means (115) for coupling a delayed trigger signal to the reset inputs.

11. A trigger (6D) as in claim 7 in which the first timer circuit (10A) comprises a slow timer circuit programmed for a relatively longer time interval, the second timer circuit (10B) comprises a fast timer circuit programmed for a relatively shorter time interval, the first input of the first flip-flop (113) each comprises an inverted input, the first and second input of the second flip-flop (213) comprises an inverted input, and the logic means (119) comprises an OR gate for providing a trigger signal upon detection of an input signal having a pulse width less than the relatively shorter time interval determined by the second, fast timer circuit or greater than the relatively longer time interval determined by the first, slow timer circuit.

12. A trigger circuit (6D) as in claim 11 further comprising:
  first means (111) for delaying the input signal to the first inverted input of the first flip-flop by an amount not greater than a characteristic reset time of the first timer circuit; and
  second means (211) for delaying the input signal to the first inverted input of the second flip-flop by an amount not greater than a characteristic reset time of the second timer circuit.

13. A trigger circuit (6D) as in claim 11 in which the first and second flip-flops each include a reset input, and the trigger circuit further comprises means (115) for coupling a delayed trigger signal to the reset inputs.

14. A trigger circuit (6E) as in claim 7 in which the input of the second timer circuit (10B) comprises an inverted input, the first and second inputs of the first flip-flop (113) each comprise an inverted input, the first and second inputs of the second flip-flop (213) each comprise an inverted input, and the logic means (119) comprises an OR gate for providing a trigger signal upon detection of an input signal of a first polarity having a pulse width less than a time interval determined by the first timer circuit or an input signal of a second polarity having a pulse width less than a time interval determined by the second timer circuit.

15. A trigger circuit (6E) as in claim 14 further comprising:
  first means (111) for delaying the input signal to the first inverted input of the first flip-flop by an amount not greater than a characteristic reset time of the first timer circuit; and second means (211) for inverting and delaying the input signal to the first inverted input of the second flip-flop by an amount not greater than a characteristic reset time of the second timer circuit.

16. A trigger circuit (6E) as in claim 14 in which the first and second flip-flops each include a reset input, and the trigger circuit further comprises means (115) for coupling a delayed trigger signal to the reset inputs.

17. A trigger circuit (6F) as in claim 7 in which the input of the second timer circuit (10B) comprises an inverted input, the first input of the first flip-flop (113) comprises an inverted input, the first input of the second flip-flop (213) comprises an inverted input, and the logic means (119) comprises an OR gate for providing a trigger signal upon detection of an input signal of a first polarity having a pulse width greater than a time interval determined by the first timer circuit or an input signal of a second polarity having a pulse width greater than a time interval determined by the second timer circuit.

18. A trigger circuit (6F) as in claim 17 further comprising:
first means (111) for delaying the input signal to the first inverted input of the first flip-flop by an amount not greater than a characteristic reset time of the first timer circuit; and
second means (211) for inverting and delaying the input signal to the first inverted input of the second flip-flop by an amount not greater than a characteristic reset time of the second timer circuit.

19. A trigger circuit (6F) as in claim 17 in which the first and second flip-flops each include a reset input, and the trigger circuit further comprises means (115) for coupling a delayed trigger signal to the reset.

* * * * *